United States Patent
Doi et al.

(10) Patent No.: US 10,578,962 B2
(45) Date of Patent: Mar. 3, 2020

(54) SELF-SUPPORTING FILM, SELF-SUPPORTING STRUCTURE, METHOD FOR MANUFACTURING SELF-SUPPORTING FILM, AND PELLICLE

(71) Applicant: ASAHI KASEI E-MATERIALS CORPORATION, Tokyo (JP)

(72) Inventors: Seitaro Doi, Tokyo (JP); Kenichiro Iwamura, Tokyo (JP); Takuji Namatame, Tokyo (JP)

(73) Assignee: ASAHI KASEI E-MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/218,837

(22) Filed: Jul. 25, 2016

(65) Prior Publication Data

US 2016/0334699 A1 Nov. 17, 2016

Related U.S. Application Data

(62) Division of application No. 13/634,337, filed as application No. PCT/JP2011/059207 on Apr. 13, 2011, now abandoned.

(30) Foreign Application Priority Data

Apr. 13, 2010 (JP) ................................. 2010-092058
Apr. 13, 2010 (JP) ................................. 2010-092459

(51) Int. Cl.
| | | |
|---|---|---|
| *G03F 1/64* | (2012.01) | |
| *G02B 1/118* | (2015.01) | |
| *G03F 1/62* | (2012.01) | |

(52) U.S. Cl.
CPC ................ *G03F 1/64* (2013.01); *G02B 1/118* (2013.01); *G03F 1/62* (2013.01); *Y10T 428/24355* (2015.01)

(58) Field of Classification Search
CPC ... G03F 1/64; G03F 1/62; G02B 1/118; Y10T 428/24355
See application file for complete search history.

(56) References Cited

U.S. PATENT DOCUMENTS

2002/0044356 A1 4/2002 Arakawa et al.
2004/0091796 A1 5/2004 Nagata
(Continued)

FOREIGN PATENT DOCUMENTS

| CN | 101071183 A | 11/2007 |
|---|---|---|
| EP | 003238 A2 | 7/1981 |

(Continued)

OTHER PUBLICATIONS

Partial Supplementary European Search Report, dated Mar. 31, 2017, for European Application No. 11768899.4.
(Continued)

*Primary Examiner* — Nancy R Johnson
(74) *Attorney, Agent, or Firm* — Birch, Stewart, Kolasch & Birch, LLP

(57) ABSTRACT

Provided is a self-supporting film that has an anti-reflection function independently, so that the self-supporting film exhibits excellent optical characteristics as a result. A self-supporting film has a rugged-structure layer having periodic rugged shapes formed on a surface thereof, with these periodic rugged shapes being formed on at least one surface. The average thickness of the self-supporting film ranges from 0.2 μm to 20.0 μm. The rugged-structure layer has a yield strain of 1% or greater and a tensile elongation of 10% or greater.

7 Claims, 10 Drawing Sheets

(56) References Cited

U.S. PATENT DOCUMENTS

| | | |
|---|---|---|
| 2004/0137336 A1 | 7/2004 | Cummings |
| 2005/0074579 A1 | 4/2005 | Suzuki et al. |
| 2005/0281954 A1 | 12/2005 | Nagata |
| 2006/0050387 A1 | 3/2006 | Arakawa et al. |
| 2006/0110664 A1* | 5/2006 | Hamada ............... G03F 1/64 430/5 |
| 2008/0032058 A1 | 2/2008 | Arakawa et al. |
| 2008/0130122 A1 | 6/2008 | Egi et al. |
| 2009/0042107 A1* | 2/2009 | Kondou ............... G03F 1/62 430/5 |
| 2009/0176015 A1 | 7/2009 | Nakanishi et al. |
| 2009/0274873 A1 | 11/2009 | Shinotsuka |
| 2010/0062217 A1 | 3/2010 | Kurematsu |
| 2010/0085633 A1* | 4/2010 | Takahashi ........ B29D 11/00865 359/355 |
| 2010/0243458 A1* | 9/2010 | Kojima ............... B29C 33/38 205/50 |

FOREIGN PATENT DOCUMENTS

| | | |
|---|---|---|
| JP | 2001-83691 A | 3/2001 |
| JP | 2001-264520 A | 9/2001 |
| JP | 2003-90902 A | 3/2003 |
| JP | 2004-157229 A | 6/2004 |
| JP | 2007-178634 A | 7/2007 |
| JP | 2008-90212 A | 4/2008 |
| JP | 2008-116979 A | 5/2008 |
| JP | 2008-197216 A | 8/2008 |
| JP | 2009-230045 A | 10/2009 |
| WO | WO 2007/034715 A1 | 3/2007 |
| WO | WO 2007/088862 A1 | 8/2007 |
| WO | WO 2009/001103 A1 | 12/2008 |
| WO | WO-2009054513 A1 * | 4/2009 ............ B29C 33/38 |
| WO | WO 2010/029997 A1 | 3/2010 |

OTHER PUBLICATIONS

European Search Report, dated Jul. 25, 2017, for European Application 11768899.4.
International Preliminary Report on Patentability and Translation of the Written Opinion of the International Searching Authority for International Application No. PCT/JP2011/059207, dated Nov. 15, 2012 (Forms PCT/IB/338, PCT/IB/373 and PCT/ISA/237).
International Search Report issued in PCT/JP2011/059207, dated Jun. 7, 2011.
Office Action for Taiwanese Application No. 100112829, dated Nov. 11, 2013.
The Office Action, dated Mar. 5, 2014, issued in the corresponding Chinese Patent Application No. 201180018926.8.
Arton resins Property Tables. Obtained from http://www.jsr.co.jp/jsr_e/pd/op_arton.shtml#02. Accessed Sep. 2, 2014.

* cited by examiner

SELF-SUPPORTING FILM, SELF-SUPPORTING STRUCTURE, METHOD FOR MANUFACTURING SELF-SUPPORTING FILM, AND PELLICLE

CROSS-REFERENCE TO RELATED APPLICATIONS

This application is a Divisional of co-pending application Ser. No. 13/634,337 filed on Sep. 12, 2012, which is a National Phase of PCT International Application No. PCT/JP2011/059207 filed on Apr. 13, 2011, which claims priority under 35 U.S.C. § 119(a) to Patent Application No. 2010-092058 filed in Japan on Apr. 13, 2010 and Patent Application No. 2010-092459 filed in Japan on Apr. 13, 2010. All of the above applications are hereby expressly incorporated by reference into the present application.

TECHNICAL FIELD

The present invention relates to a self-supporting film, such as a anti-reflection film or the like, that can be suitably used in optical designs of, for instance, image-capture optical systems such as cameras, projection optical systems such as display devices, and observation optical system such as image display devices, and relates also to a self-supporting structure that uses the self-supporting film, and to a method for manufacturing the self-supporting film. The present invention relates also to a pellicle that is used for preventing adhesion of foreign matter onto a photomask or reticle that is used in lithography during the manufacture of semiconductor devices such as ICs (integrated circuits), LSI (large scale integration), TFT-type LCDs (thin film transistor-type liquid crystal displays) and the like.

BACKGROUND ART

Anti-reflection films having wavelength-level fine rugged shapes on the surface and intended for use in displays, solar cells and optical elements have been developed in recent years as alternatives to conventional anti-reflection films that rely on interference. Through formation, on the anti-reflection film, of rugged shapes such that the volume occupied by the shapes increases from an air interface side towards a base material side, an effect is elicited on incident light, as though the refractive index of the film increased gradually from 1, which is the refractive index of air, up to the refractive index of the base material. Reflection at the interface, caused by dissimilar refractive indices, can thus be suppressed. The manufacture of such anti-reflection films is more complex than that of conventional anti-reflection films that rely on interference. However, anti-reflection films having such rugged shapes are advantageous in that they boast a better angle characteristic, and allow realizing lower reflectivity over a wider wavelength band than interference-based anti-reflection films. A known method (Patent Literature 1) for manufacturing an anti-reflection film having such rugged shapes involves, for instance, filling a mold having periodic rugged shapes with a curable resin composition or a thermoplastic resin in a molten state, and curing then the resin, followed by demolding.

Patent Literature 2 discloses an anti-reflection stack that comprises a light-transmissive base material and an anti-reflection layer, having a month-eye structure, on the light-transmissive base material.

CITATION LIST

Patent Literature

Patent Literature 1: Japanese Patent Application Publication No. 2008-197216
Patent Literature 2: Japanese Patent Application Publication No. 2009-230045

The shapes of optical elements that are used in optical devices have become more complex in recent years accompanying the growing sophistication of the optical devices. This growing complexity in optical element shapes calls in turn for anti-reflection films that are capable of conforming to an optical element that has a complex shape, specifically an optical element such that cross-sections thereof in two perpendicular axial directions are those of a curved surface shape, for instance an optical element having a spherical surface shape. In the field of pellicles, a self-supporting film imparted with an anti-reflection characteristic, even without using a base material, can yield a self-supporting film, also in a case where the self-supporting film does not have a stacked structure.

However, after filling a curing of the UV-curable resin or thermosetting resin in the mold having a rugged structure, as disclosed in Patent Literature 1 and Patent Literature 2, a problem arose in that, when attempting to form a thin film in the production of a self-supporting film through demolding, the film was difficult to produce on account of film breakage.

A similar problem occurred when producing a self-supporting film having a rugged structure, through demolding, after cooling and curing of a molten thermoplastic resin that filled a mold.

Moreover, if the entire system is thick, the self-supporting film fails in some cases to conform to the shape of a member the cross-sections whereof in two perpendicular axial directions are those of a curved surface shape, such as a member having a spherical surface shape, upon affixing of the self-supporting film to the member, and gaps (air gaps) appear in between, so that, as a result, the anti-reflection effect fails to be elicited.

SUMMARY OF INVENTION

Technical Problem

In the light of the above problems, it is an object of the present invention to provide a self-supporting film that has an anti-reflection function independently, so that the self-supporting film boasts excellent optical characteristics as a result.

Solution to Problem

As a result of diligent research, the inventors found that a self-supporting film of a thinness that was not possible to achieve according to conventional techniques could be produced in accordance with a production method that is wholly different from conventional manufacturing methods. The inventors further found that by specifying the thickness and the material of the self-supporting film it became possible to achieve a self-supporting film that has excellent shape conforming ability and is unlikely to give rise to gaps when affixed to a member the cross-sections whereof in two perpendicular axial directions are those of a curved surface shape, such as a member having a spherical surface shape.

The present invention, the characterizing features whereof are set forth below, was perfected on the basis of the above findings.

[1] The self-supporting film according to the present invention is a self-supporting film having a rugged-structure layer in which periodic rugged shapes are formed on at least one face.

The self-supporting film according to the present invention can be independently imparted with an anti-reflection function by having a rugged-structure layer on at least one face, even if the self-supporting film is not stacked on a separate base material or the like. As a result, a self-supporting film can be obtained that boasts excellent optical characteristics.

[2] The self-supporting film according to [1], wherein an average thickness of the self-supporting film ranges from 0.2 μm to 20.0 μm.

[3] The self-supporting film according to [1] or [2], wherein the rugged-structure layer has a yield strain of 1% or greater and a tensile elongation of 10% or greater.

[4] The self-supporting film according to any one of [1] to [3], wherein a thickness variability average of the rugged-structure layer is 100 nm or less.

[5] The self-supporting film according to any one of [1] to [4], wherein in a main component of the rugged-structure layer there is used at least one resin selected from the group consisting of a fluororesin having a perfluoroalkyl ether cyclic structure, a cellulose derivative, and a cycloolefin resin.

[6] The self-supporting film according to any one of [1] to [5], wherein protrusions in the rugged shapes are disposed at a constant periodic spacing.

[7] The self-supporting film according to any one of [1] to [6], wherein the periodic spacing of the protrusions of the rugged shapes is 1.0 μm or less.

[8] The self-supporting film according to any one of [1] to [7], wherein a height of the protrusions of the rugged shapes ranges from 0.5 times to 2.0 times the periodic spacing of the rugged shapes.

[9] The self-supporting film according to any one of [1] to [8], wherein the shape of the protrusions of the rugged shapes is a polyhedral pyramidal shape, a conical shape, a truncated polyhedral pyramidal shape or a truncated conical shape.

[10] A self-supporting structure, comprising: the self-supporting film according to any one of [1] to [9], and a release body that is provided on a rear face of the self-supporting film and that can be stripped off the self-supporting film.

[11] The self-supporting structure according to [10], wherein the rugged-structure layer and the release body are in contact with each other.

[12] The self-supporting structure according to [10] or [11], wherein a surface of the release body opposing the rugged-structure layer has a substantially spherical surface shape.

[13] A self-supporting structure, comprising: the self-supporting film according to any one of [1] to [9], and a pressure-sensitive adhesive agent layer or adhesive agent layer provided on a rear face of the self-supporting film.

[14] The self-supporting structure according to [13], wherein the rugged-structure layer and the pressure-sensitive adhesive agent layer or adhesive agent layer are in contact with each other.

[15] A manufacturing method of the self-supporting film according to any one of [1] to [9], the method including: coating a film formation substrate, having periodic rugged shapes at a surface, with a polymer solution obtained by dissolving in an organic solvent a resin composition having a yield strain of 1% or greater and a tensile elongation of 10% or greater, followed by drying and stripping, to yield a self-supporting film having an average thickness ranging from 0.2 μm to 20.0 μm.

[16] A manufacturing method of the self-supporting film according to any one of [1] to [9], the method including: forming a self-supporting film by coating a film formation substrate, having recessed shapes at a substrate surface, with a self-supporting film material, to a predetermined film thickness, and stripping thereafter the self-supporting film from the film formation substrate.

[17] The self-supporting film manufacturing method according to [16], wherein silane coupling is performed on the substrate surface.

[18] A pellicle having a frame body, a pressure-sensitive adhesive agent that is applied onto one end face of the frame body, and the self-supporting film according to any one of [1] to [9] bonded to the other end face of the frame body, wherein the pellicle has the rugged-structure layer on an inner face side and/or an outer face side of the self-supporting film.

Advantageous Effect of Invention

The present invention succeeds in providing a self-supporting film that has an anti-reflection function independently, so that the self-supporting film boasts excellent optical characteristics as a result. The present invention, moreover, succeeds in providing a self-supporting film that is excellent in shape conforming ability, through thickness adjustment. As a result, gaps are extremely unlikely to arise upon affixing of the self-supporting film to a member such that cross-sections thereof in two perpendicular axial directions are those of a curved surface shape.

DESCRIPTION OF EMBODIMENTS

A mode for carrying out the present invention (hereafter, simply "the present embodiment") will be explained next in detail. The present embodiment is an example for explaining the present invention, but the invention is not meant to be limited to the features set forth below.

The self-supporting film of the present invention is a self-supporting film having a rugged-structure layer that has periodic rugged shapes formed on the surface thereof, the self-supporting film being characterized by having a rugged-structure layer in which periodic rugged shapes are formed on at least one face. The periodic structure encompasses a periodic structure of random rugged shapes or random pitch.

First Embodiment

Figure 1:
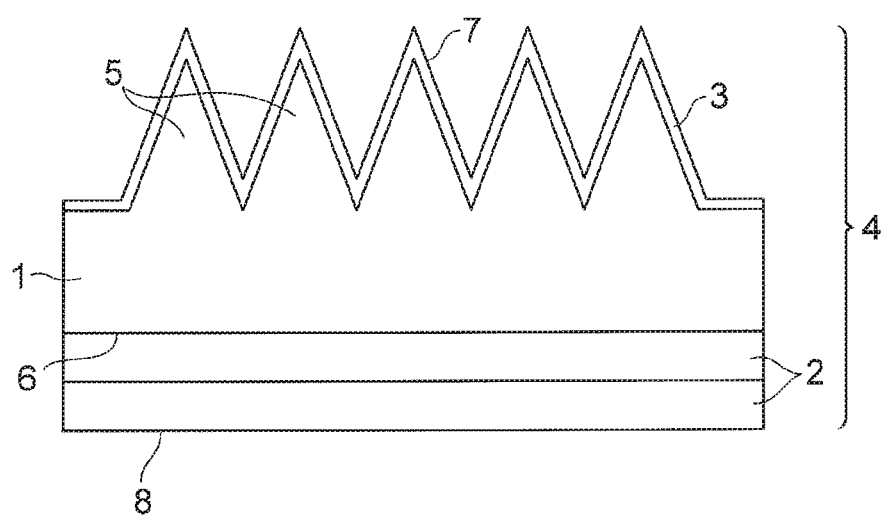
FIG. 1 is a partial enlarged cross-sectional diagram of an example of a self-supporting film according to an embodiment of the present invention.

A first embodiment of the present invention will be explained first. FIG. 1 is a partial enlarged cross-sectional diagram of an example of a self-supporting film according to the present embodiment. In FIG. 1, a self-supporting film 4 comprises a rugged-structure layer 1 having periodic rugged shapes 5 formed on one surface thereof, and comprises a thin-film layer 2 formed on the other surface of the rugged-structure layer 1.

Herein, the term rugged-structure layer denotes a layer having periodic rugged shapes on a surface thereof, the layer being formed integrally with the rugged shapes.

In a case where the periodic rugged shapes are provided on one face of the rugged-structure layer and no periodic rugged shapes are provided on the other face, the face at which no periodic rugged shapes are provided is a rear face. In a case where the periodic rugged shapes are provided on both faces of the rugged-structure layer, the face with the larger rugged shape period is the rear face. If the periods of the rugged shapes are identical, then either face may be the rear face.

Figure 4:
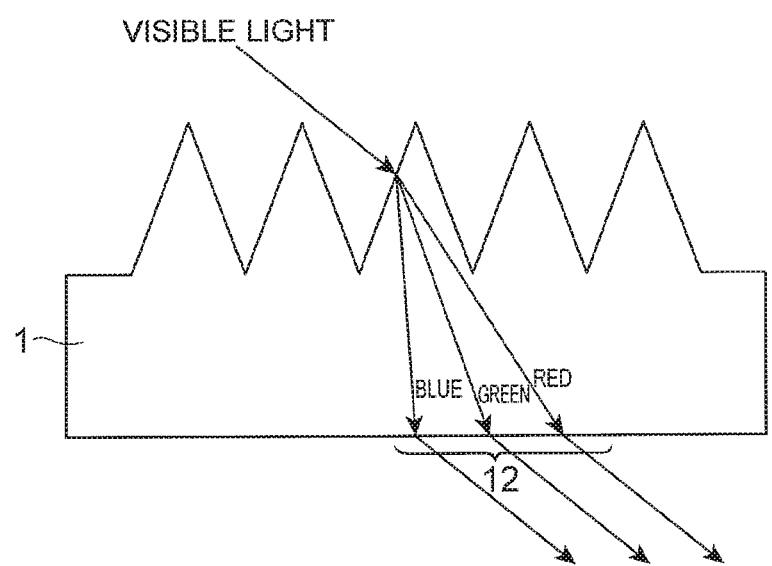
FIG. 4 is a schematic diagram for explaining aberration-derived positional offset.

The self-supporting of the present embodiment is formed to a thickness ranging from 0.2 μm to 20.0 μm, i.e. to be significantly thinner than conventional self-supporting films. As a result, the self-supporting film is excellent in shape conforming ability. Also, gaps are very unlikely to form even when the film is affixed to a member such that cross-sections thereof in two perpendicular axial directions are those of a curved surface shape, for instance a member having a spherical surface shape. The shape conforming ability of the self-supporting film improves as the thickness average of the film decreases. In terms of ease of production of a strong and homogeneous self-supporting film, however, the thickness average of the self-supporting film ranges preferably from 0.3 μm to 15.0 μm, more preferably from 0.5 μm to 10.0 μm, and particularly preferably from 0.7 μm to 6.0 μm. Setting the thickness average to be 20.0 μm or less is also preferable from the viewpoint of reducing aberration-derived positional offset. Herein, the term aberration-derived positional offset denotes positional offset caused by differences in refractive indices between substances depending on the wavelength of light. FIG. 4 is a schematic diagram for explaining aberration-derived positional offset. The refraction angle at the interface at which the self-supporting film is struck obliquely by light varies depending on the wavelength, aberration 12 is generated as a result in that the position at which transmitted light exits after having passed through the self-supporting film is shifted depending on the wavelength. If the aberration-derived positional offset is large, problems arise in that optical design after transmission through the self-supporting film becomes complex, and in that it is harder to achieve a precise optical design. The thickness average of the self-supporting film, ranging from 0.2 μm to 20.0 μm, is significantly smaller than that of conventional self-supporting films. Therefore, aberration-derived positional offset is extremely small.

The shape of protrusions in the rugged shapes is not particularly limited, but, preferably, the shape of the protrusions changes continuously in a height direction, since in that case the anti-reflection effect is more pronounced. An effect is also elicited of increasing average transmittance of broadband light, since the lowest value of transmittance becomes particularly high. Preferred conceivable shapes of the protrusions include, for instance, shapes the cross-section whereof in the thickness direction is trapezoidal, rectangular, square, prismatic, triangular or semicircular. Preferred conceivable rugged shapes include, for instance, a shape that results from continuously arranging protrusions the cross-sectional shape whereof, in the thickness direction, is trapezoidal, rectangular, square, prismatic, triangular or semicircular, as well as sinusoidal wave shapes or the like. Herein, a sinusoidal wave shape denotes a shape having a curved portion that comprises repetitions of depressions and projections. It is sufficient for the curved portion to be a bent curve, and thus the sinusoidal wave shape encompasses also shapes in which projections exhibit constrictions. Among these cross-sectional shapes, triangular shapes and sinusoidal wave shapes elicit a pronounced anti-reflection effect.

The cross-sectional shape of the protrusions is preferably a shape that changes continuously in the height direction, namely a trapezoidal, rectangular, square, prismatic, triangular or semicircular shape, in two perpendicular axial directions, since the difference in the anti-reflection effects depending on the incidence direction of light is smaller in that case. Preferred conceivable protrusion shapes include, for instance, polyhedral pyramidal shapes, namely triangular pyramids, square pyramids and hexagonal pyramidal shapes or conical shapes, as well as truncated polyhedral pyramidal shapes, truncated conical shapes and the like. A truncated polyhedral pyramid denotes herein a shape resulting from horizontally cutting off the apex portion of a polyhedral pyramid, and a truncated cone denotes a shape resulting from horizontally cutting off the apex portion of a cone. Portions in contact with the various faces of the polyhedral pyramidal shape, conical shape, truncated polyhedral pyramidal shape and truncated conical shape may be curved surfaces, and joining portions between adjacent protruding shapes may be curved surfaces.

From the viewpoint of an anti-reflection effect, planar portions are preferably avoided as much as possible in the self-supporting film surface. Specifically, the occupancy of rugged shapes in the self-supporting film surface is preferably 70% or greater, more preferably 85% or greater, and particularly preferably 95% or greater.

Preferably, the bottom face shape of the protrusions is a shape that allows for gap-less tessellation on a plane, in order to increase the occupancy of the rugged shapes. Preferably, therefore, the rugged shapes are grid-like rugged shapes wherein depressions and projections are present in a one axial direction, or shapes resulting from continuously arranging protrusions the bottom faces whereof can be tessellated, for instance (truncated) triangular pyramids, (truncated) square pyramids, (truncated) hexagonal pyramids or the like. In a case where cones or truncated conical shapes are used, a hexagonal close-packed structure is preferably used. Preferably, the shapes are disposed in such a manner that the skirts of adjacent cones overlap each other, in such a way that as few planar portions as possible are formed in the rugged-structure layer surface.

Preferably, the rugged shapes are shapes such that the angle dependence of the anti-reflection effect is as small as possible. Preferably, the cross-sectional shape, in the thickness direction, of the rugged shapes, is the same in two perpendicular axial directions, since the angle dependence is smaller in that case. As the shape of the protrusions, therefore, a shape is resorted to that has identical cross-sectional shapes in two perpendicular axial directions, namely a polyhedral pyramidal shape, a conical shape, a truncated polyhedral pyramidal shape or a truncated conical shape. In particular, a conical shape or a truncated conical shape is preferred from the viewpoint of angle dependence. A conical shape or a polyhedral pyramidal shape is preferable in terms of the anti-reflection effect, since a shape that changes continuously in the height direction is preferred.

The periodic spacing of the rugged shapes is preferably comparable to or smaller than the used wavelength, since the anti-reflection effect is more pronounced in that case. Ordinarily, wavelengths from 150 nm to 2000 nm are used in optical elements. In order to increase the anti-reflection effect, therefore, the periodic spacing of the rugged shapes is preferably 250 nm or smaller. More preferably, the periodic spacing of the rugged shapes is 150 nm or smaller, and particularly preferably 75 nm or smaller, and is preferably 1 nm or greater, in terms of manufacturability. The height of the protrusions ranges preferably from 0.5 times to 2.0 times, in particular 1.0 time to 2.0 times, the periodic spacing of the rugged shapes, since good optical characteristics can be achieved in that case. As defined herein, the height of the protrusions refers to the difference between the height of the protrusion apex and of the recess bottom point of the periodic rugged shapes.

In a case where the shape of the protrusions is a pyramidal shape or a conical shape, the height of the protrusions is preferably 0.3 or more times the used wavelength, since a pronounced anti-reflection effect can be achieved in that case. If the shape of the protrusions is a square pyramidal shape, the height of the protrusions is preferably 0.5 or more times the used wavelength, in the case of a conical shape, the height of the protrusions is 0.45 or more times the used wavelength, in the case of a shape where cones are superposed in the horizontal direction, the height of the protrusions is preferably 0.65 or more times, since a particularly pronounced anti-reflection effect can be achieved in those cases. The greater the height of the protrusions, the more preferable the height is. However, a sufficient anti-reflection effect can be achieved for heights up to 1 μm.

The rugged shapes may be positioned not only on one face of the self-supporting film and the rugged-structure layer, but also on both faces. In a case where the rugged shapes are provided on both faces, the anti-reflection effect can be made more pronounced than when the rugged shapes are provided on one face alone. Accordingly, it is preferable to provide the rugged shapes on both faces. Preferably, the rugged shapes are provided on a side that is in contact with a below-described pressure-sensitive adhesive agent layer or adhesive agent layer, since in such a case, adhesiveness with the pressure-sensitive adhesive agent layer is improved by virtue of the resulting anchoring effect.

Figure 5:
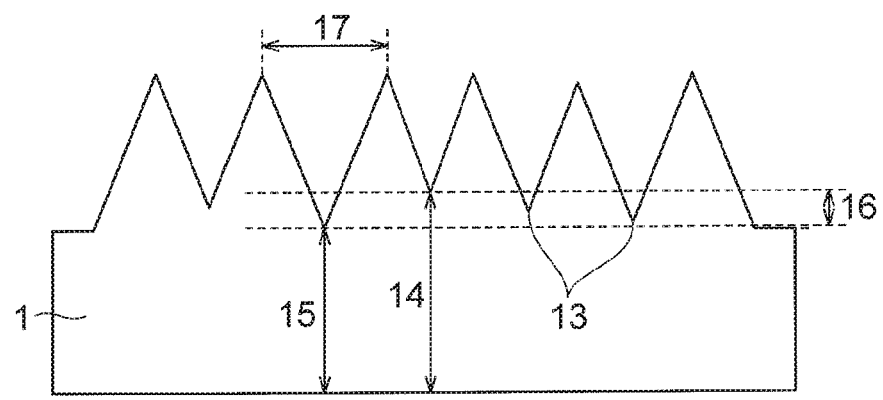
FIG. 5 is a partial enlarged cross-sectional diagram of an example of a rugged-structure layer according to an embodiment of the present invention.

Preferably, the thickness variability average is set to be no greater than the wavelength that is used. FIG. 5 is a partial enlarged cross-sectional diagram of an example of the rugged-structure layer according to an embodiment of the present invention. A difference between a (smallest) distance 15 from a recess bottom point 13 of the periodic rugged shapes 5 that are provided on one face of the rugged-structure layer 1 up to a rear face of the rugged-structure layer 6, and the (greatest) distance 14 from the recess bottom point 13 up to the rear face of the rugged-structure layer 6 gives a thickness variability 16 of the rugged-structure layer. The arithmetic average of the distance from the recess bottom point 13 to the rear face of the rugged-structure layer 6 is the thickness variability average.

Figure 2:
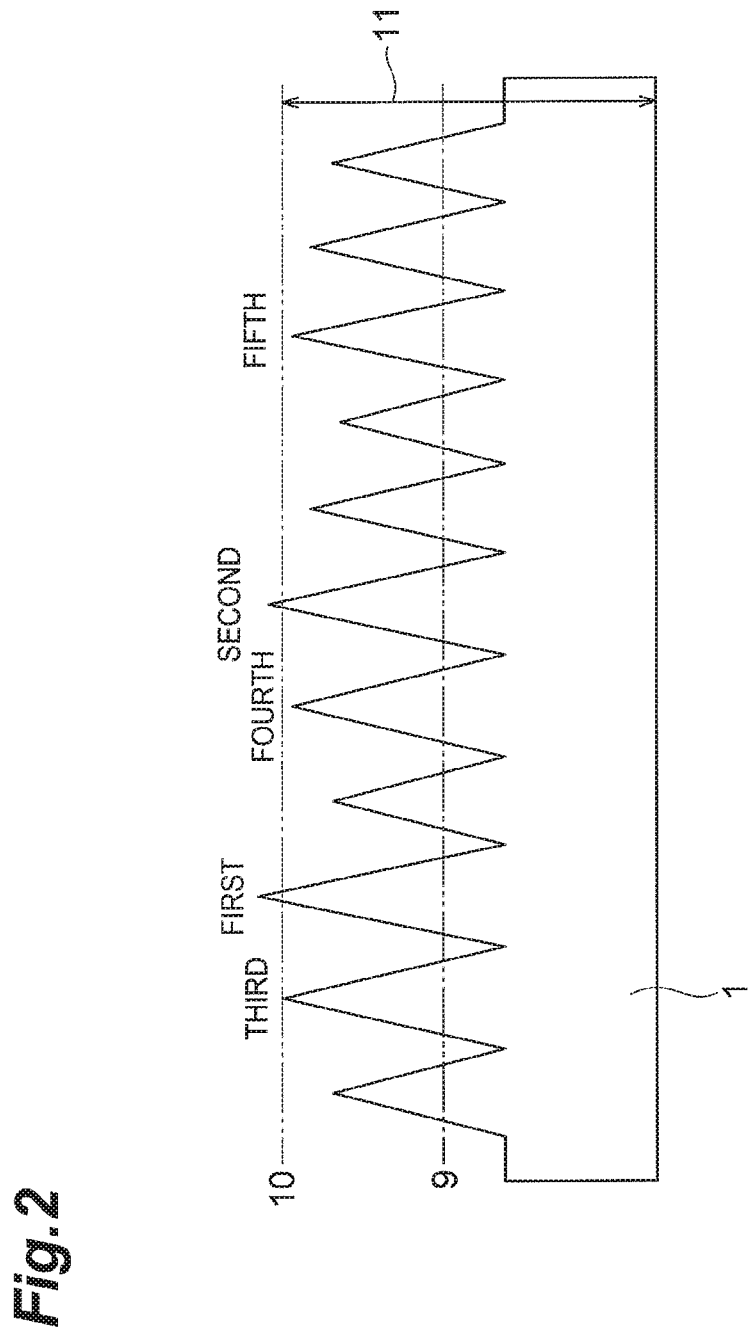
FIG. 2 is a partial enlarged cross-sectional diagram of an example of a rugged-structure layer according to an embodiment of the present invention.

The thickness of the rugged-structure layer 1 is the thickness from the rear face of the rugged-structure layer to the protrusion apex. A thickness 11 of the rugged-structure layer 1 can be obtained by, for example, as shown in FIG. 2, extracting protrusion apices in order of decreasing height to an n-th (for instance, 5-th) highest protrusion apex, and taking the thickness 11 as the dimension from an average height 10 of the extracted apices up to the rear face of the rugged-structure layer.

If use in the visible light region is envisaged, the thickness variability average is preferably 100 nm or smaller, more preferably 50 nm or smaller. If use in the ultraviolet light region is also envisaged, the thickness variability average is preferably 50 nm or smaller, more preferably 10 nm or smaller. Setting the thickness variability average to be 100 nm or smaller is appropriate from the viewpoint of reducing appreciable color unevenness when the film is used as a self-supporting film.

A coating layer 3 may be provided on the surface of the rugged shapes 5. Conceivable examples of a coating layer include, for instance, a hardcoat layer, a metal thin-film layer or some other self-supporting layer, a moisture-barrier layer, an anti-static layer, an electromagnetic wave shielding layer, a near-infrared absorbing layer, an ultraviolet absorbing layer, a selective-absorption filter layer or the like. The coating layer may be a stack of any number of layers.

Examples of the abovementioned hardcoat layer include, for instance, known acrylic polymers, urethane polymer, epoxy polymers, silicone polymers that are curable resins which are cured by actinic radiation; and also silica-based compounds and single or composite compounds of oxides, nitrides, halides or carbides of silicon (Si); as well as metal thin-film layer or the like. Examples of the metal thin-film layer include, for instance, single or composite compounds of oxides, nitrides, halides or carbides of metals such as aluminum (Al), chromium (Cr), yttrium (Y), zirconia (Zr), tantalum (Ta), titanium (Ti), barium (Ba), indium (In), tin (Sn), zinc (Zn), magnesium (Mg), calcium (Ca), cerium (Ce), copper (Cu), silver (Ag), gold (Au) or the like. Other examples of the self-supporting layer include, for instance, a tetrafluoroethylene-vinylidene fluoride-hexafluoropropylene terpolymer, a fluororesin having a perfluoroalkyl ether cyclic structure (preferably, in particular, Teflon (registered trademark) AF by Du Pont; Cytop (trade name) by Asahi Glass, or Algoflon (trade name) by Ausimont, or polyfluoroacrylate); or a self-supporting layer that is formed out of a material having a low refractive index, for instance calcium fluoride, magnesium fluoride or barium fluoride.

The outermost layer of the coating layer that forms the self-supporting film surface 7 is preferably a resin layer, in order to suppress scratching to an optical member, and is, in particular, a resin layer having a durometer hardness (measured according to JIS K7215) that ranges from HDA 30 to HDD 90. From the viewpoint of conforming ability to a member having a spherical surface shape, the coating layer is preferably a resin layer across all layers. Preferably, in particular, a resin layer having a durometer hardness (measured according to JIS K7215) that ranges from HDA 30 to HDD 90 across all layers. Preferably, the coating layer has a refractive index that is as close as possible to that of the rugged shapes of the rugged-structure layer, since the anti-reflection effect is more pronounced in such a case. The coating layer is not comprised in the rugged-structure layer, as is obvious from the definition of the rugged-structure layer.

A thin-film layer may be overlaid on the rear face of the rugged-structure layer. Preferably, self-supporting layers such as the above-described ones or metal thin-film layers are used as the thin-film layer. The thin-film layer may be a single layer or a multilayer. The thin-film layer on the rear face is not comprised in the rugged-structure layer, as is obvious from the definition of the rugged-structure layer.

A self-supporting structure can be formed out of the self-supporting film and a release body that is provided on the rear face of the self-supporting film and that can be stripped off the self-supporting film. In this case, the rugged-structure layer and the release body are preferably in contact with each other. Such a self-supporting structure is appropriate from the viewpoint of handling the anti-reflection film in an easy manner before use. Preferably, the surface of the release body that opposes the rugged-structure layer is a substantially spherical surface shape (or spherical surface shape), since in that case the self-supporting film can be stripped off easily from the release body.

The self-supporting structure can be formed of the self-supporting film and a pressure-sensitive adhesive agent layer or adhesive agent layer that is provided on the rear face of the self-supporting film. In this case, the rugged-structure layer and the pressure-sensitive adhesive agent layer or adhesive agent layer are preferably in contact with each other. Such a self-supporting structure is appropriate from the viewpoint of handling the self-supporting film in an easy manner before use.

A method for producing the self-supporting film is explained next.

The method for producing the self-supporting film is not particularly limited, and may be a method that involves, for instance, coating a film formation substrate, having periodic rugged shapes on a surface, with a polymer solution that is obtained by dissolving, in an organic solvent, a resin composition having a yield strain of 1% or greater and a tensile elongation of 10% or greater, followed by drying and stripping, to yield a self-supporting film having a thickness average ranging from 0.2 μm to 20.0 μm.

If the resin composition that yields the film material of the rugged-structure layer has a yield strain of 1% or greater and a tensile elongation of 10% or greater, then a rugged-structure layer can be produced that has a thickness average ranging from 0.2 μm to 20.0 μm, upon formation of a rugged-structure layer in accordance with the below-described production method.

Self-supporting films are often designed having in mind an anti-reflection effect against visible light or ultraviolet light. Preferably, therefore, the resin comprised in the resin composition has high transmittance in the visible light region and the ultraviolet region. Specific examples of such resins include, for instance, amorphous thermoplastic resins such as: poly(methyl methacrylate) resins, polycarbonate resins, polystyrene resins, cross-linked polyethylene resins, polyvinyl chloride resins, polyarylate resins, polyphenylene ether resins, modified polyphenylene ether resins, polyether imide resins, polyether sulfone resins, polysulfone resins, polyether ketone resins or the like; cellulose derivatives (cellulose acetate, cellulose acetate propionate, cellulose acetate butyrate or the like, or mixtures of two or more of the foregoing); cycloolefin resins (for instance, polymers or copolymers (including hydrogenated ones) of norbornene, for instance Apel (registered trademark) (by Mitsui Chemicals), Topas (registered trademark) (by Polyplastics), Zeonex (registered trademark) or Zeonor (registered trademark) (by Zeon), Arton (registered trademark) (JSR) or the like); a fluororesin (for instance, a tetrafluoroethylene-vinylidene fluoride-hexafluoropropylene terpolymer, a fluororesin having a perfluoroalkyl ether cyclic structure (preferably, in particular, Teflon (registered trademark) AF by Du Pont; Cytop (trade name) by Asahi Glass, or Algoflon (trade name) by Ausimont); or crystalline thermoplastic resins such as polyethylene terephthalate (PET) resins, polyethylene naphthalate resins, polyethylene resins, polypropylene resins, polybutylene terephthalate resins, aromatic polyester resins, polyacetal resins, polyamide resins or the like.

From among the above resins, a resin having a yield strain of 1% or greater and a tensile elongation of 10% or greater is preferably used as the main component of the resin composition. The term main component indicates that the amount of resin component having a yield strain of 1% or greater and a tensile elongation of 10% or greater comprised in the resin composition is 50 wt % or greater.

Among resins having a yield strain of 1% or greater and a tensile elongation of 10% or greater, fluororesins having a perfluoroalkyl ether cyclic structure, cycloolefin resins and cellulose derivatives (preferably, in particular, cellulose acetate propionate, cellulose acetate butyrate, cellulose propionate, cellulose acetate or the like) have particularly good releasability from the below-described film formation substrate having rugged shapes, and boast excellent stretchability, and a thinner rugged-structure layer can be produced as a result. Particularly preferred are fluororesins having a perfluoroalkyl ether cyclic structure. The amount of resin component having a yield strain of 1% or greater and a tensile elongation of 10% or greater comprised in the resin composition is preferably 80% or greater, more preferably 90% or greater, and particularly preferably 95% or greater. Depending on the intended use, ultraviolet absorbents, light stabilizers and antioxidants or the like for enhancing the effect of a light stabilizer may also be blended into the resin composition.

The rugged-structure layer can be produced by coating the film formation substrate, having periodic rugged shapes on the surface, with a polymer solution (self-supporting film material) resulting from dissolving, in an organic solvent, the resin composition having a yield strain of 1% or greater and a tensile elongation of 10% or greater, to a predetermined film thickness, followed by drying and stripping off the film formation substrate.

Preferably, the material of the film formation substrate allows securing sufficient planarity, and is preferably, for instance, synthetic quartz, fused quartz, alkali-free glass, low-alkali glass, soda lime glass, silicon, a nickel sheet or the like. In particular, silicon is preferably used, since silicon allows securing the planarity of the substrate surface, with high precision, and allows forming easily a rugged pattern on the substrate surface.

The smaller the coefficient of thermal expansion of the film formation substrate, the more preferable the coefficient is, in the light of the concern of breakage of the film formation substrate on account of uneven temperature during the below-described drying of the rugged-structure layer. In particular, the linear expansion coefficient from 0° C. to 300° C. is preferably $50 \times 10^{-7}$ m/° C. or less. It is sufficient for rugged shapes on the film formation substrate surface to be imparted with a shape that corresponds to the rugged shapes of the above-described rugged-structure layer A method for producing the film formation substrate having rugged shapes on the substrate surface is explained next. A photoresist is coated onto a transparent substrate (preferably, synthetic quartz glass) provided with a chromium thin-film layer, and the whole is pre-baked. Thereafter, rugged shapes are drawn on the resist using an electron beam exposure apparatus. The rugged shapes that are drawn on the chromium thin-film layer yield shapes that correspond to the rugged shapes of the rugged-structure layer. After a developing treatment, the chromium layer portion that is exposed from the pattern of the resist is etched, and the resist pattern is transferred to the chromium layer. Lastly, the resist residue is washed, to produce a reticle.

A photoresist is uniformly coated onto the film formation substrate, followed by prebaking to fix the photoresist. Using a reduction-projection exposure apparatus (stepper), which is an apparatus for semiconductor element manufacture, a fine pattern of the reticle produced earlier is reduced using a reduction-projection lens, and projection exposure is carried out while the apparatus moves over a wafer coated with the photoresist. Next, the photoresist in the photosensitized portion is removed through immersion in an organic alkaline developing solution. The photosensitized residue is further removed by being rinsed, several times, with ultrapure water, followed by heating. The portions not covered by the photoresist are selectively etched by dry etching, to form a fine pattern on the wafer. Lastly, the photoresist is completely removed using a solvent, as a result of which there can be obtained a film formation substrate having rugged shapes on the substrate surface. The shape of the periodic rugged shapes on the film formation substrate can be freely modified by modifying the pattern size of the reticle and the exposure and etching conditions. The above-described method is an example a method for producing the film formation substrate, but the production method is not limited thereto.

Examples of the coating method of the polymer solution onto the film formation substrate include, for instance, spin coating, roll coating, knife coating, casting or the like, but spin coating is particularly preferred in terms of film thickness uniformity, management of foreign matter, and achieving a thinner film. A film production method by spin coating is explained next.

The rugged-structure layer is produced using a polymer solution that is obtained by dissolving the above-described film material in an organic solvent. Preferably, very little solvent volatilizes at ambient temperature, and the solvent has a boiling point that is not excessively high. Such being the case, the boiling point of the solvent ranges preferably from 100 to 200° C. Examples of such a solvent include, for instance, aliphatic hydrocarbon compounds, aromatic compounds, halogenated hydrocarbons such as chlorinated hydrocarbons, ester compounds, ketone compounds and the like. Organic solvents from among the foregoing that can be appropriately used for cycloolefin resins include, for instance, saturated aliphatic hydrocarbon compounds such as alicyclic hydrocarbons, as well as aromatic compounds, halogenated hydrocarbons or the like. Cellulose derivatives can dissolve in a single or mixed organic solvent of chlorinated hydrocarbons, ketones, esters, alkoxyalcohols, benzene, alcohols and the like. Examples of such organic solvents include, for instance, organic solvents such as chlorinated hydrocarbons, ester compounds, ketone compounds and the like. Examples of chlorinated hydrocarbon that can be appropriately used include, for instance, methylene chloride, ethylene chloride and propylene chloride. Examples of ketone-compound organic solvents that are appropriately used include, for instance, acetone, methyl ethyl ketone, methyl isobutyl ketone and the like. Examples of ester-compound organic solvents that are appropriately used include, for instance, acetic acid esters (methyl acetate, ethyl acetate, butyl acetate and the like) and lactic acid esters (ethyl lactate, butyl lactate and the like). Other than the above there can be used a single or mixed solvent of benzene, ethanol, methanol, cellosolve acetate, carbitol and the like. Preferably, the concentration of the polymer solution ranges from 1 to 10 wt %, since thickness variability in the rugged-structure layer during drying is smaller in that case. More preferably, the concentration of the polymer solution ranges from 3 to 8 wt %. Preferably, the absorbance of the polymer solution is 0.05 or less, in order to increase light transmittance in the rugged-structure layer and reduce the amount of foreign matter in the rugged-structure layer.

The thickness and homogeneity (thickness variability) of the rugged-structure layer is determined mainly by the liquid temperature of the polymer solution, the ambient temperature and humidity, and the revolutions of the film formation substrate. From the viewpoint of film thinness and homogeneity, the liquid temperature of the polymer solution is preferably about the same as ambient temperature (10 to 30° C.), and the temperature of the film formation substrate as well is preferably about the same as ambient temperature. The liquid temperature, the ambient temperature and the temperature of the film formation base are preferably substantially identical, since thickness variability can be suppressed in such a case. Preferably, humidity ranges from 30 to 60%. An appropriate amount of polymer solution is dripped onto the film formation substrate, and thereafter film formation is performed by spinning the film formation substrate at 50 to 5000 revolutions per minute. From the viewpoint of film homogeneity, spinning is performed at a speed ranging from 50 to 500 revolutions per minute, more preferably from 75 to 400 revolutions per minute, and yet more preferably from 100 to 300 revolutions per minute. The spinning time is preferably set to range from 30 seconds to 120 seconds, more preferably from 30 seconds to 60 seconds.

An appropriate film thickness of the rugged-structure layer ranges from about 0.2 µm to 20.0 µm. In terms of ease of production of a strong and homogeneous rugged-structure layer, the thickness average of the rugged-structure layer ranges preferably from 0.3 µm to 15.0 µm, more preferably from 0.5 µm to 10.0 µm, and particularly preferably from 0.7 µm to 6.0 µm.

After film formation, the film formation substrate is placed on a heated hot plate, and is left to dry, to cause the solvent to volatilize thereby. From the viewpoint of film homogeneity, drying is preferably performed in two stages, namely low-temperature drying and high-temperature drying. Preferably, drying is performed at 30° C. to 90° C. for to about 4 minutes to 15 minutes, and thereafter, at 50° C. to 200° C. for about 4 minutes to 30 minutes.

After drying, the film is stripped off the substrate. Mold releasability is an important issue upon stripping of the rugged-structure layer off the substrate. The contact angle between the substrate and the film material of the rugged-structure layer must be optimized in order to facilitate film formation by spin coat and facilitate stripping after film formation. Silane coupling is a known method of controlling the contact angle of substrates. In order to elicit coupling of a substrate that comprises an inorganic material, a silane having an ether bond at one terminus is brought into contact with the substrate surface, and the silane is caused to react. Releasability is enhanced by using, as the other terminal group, a group having low affinity with the film material. In order to realize high releasability, preferably, the other terminal group is, in particular, fluorine, since fluorine is highly effective as a releasing agent.

Given that stress acts on a film during stripping of the film off the substrate, the yield strain of the rugged-structure layer must be set to 1% or greater, and the tensile elongation must be set to 10% or greater, through the use of the resin composition having a yield strain of 1% or greater and a tensile elongation of 10% or greater, in order to strip the film off the substrate while suppressing film breakage of the thin rugged-structure layer having a thickness ranging from 0.2 µm to 20.0 µm. The greater the yield strain and the tensile elongation, the more preferable these are, since film breakage becomes then unlikelier during stripping of the film off the substrate, and there can be produced a rugged-structure layer and a self-supporting film with a greater surface area. More preferably, the yield strain is 2% or greater, yet more preferably 4% or greater and particularly preferably 5% or greater. More preferably, the tensile elongation is 50% or greater, yet more preferably 100% or greater and particularly preferably 160% or greater. The upper limits of yield strain and tensile elongation are not particularly limited, but film breakage can be sufficiently suppressed if the yield strain ranges from 1% to 30% and the tensile elongation ranges from 10% to 500%.

From the viewpoint of productivity, the greater the surface area of the self-supporting film and the rugged-structure layer, the more preferable the surface area is. Preferably, the surface area is 100 cm$^2$ or larger, more preferably 300 cm$^2$ or larger, yet more preferably 700 cm$^2$ or larger, and particularly preferably 1000 cm$^2$ or larger. From the viewpoint of thickness homogeneity, however, the surface area of the anti-reflection film and the rugged-structure layer is preferably 35000 cm$^2$ or smaller.

If the produced rugged-structure layer has a yield strain of 1% or greater and a tensile elongation of 10% or greater, the rugged-structure layer can stretch while being pulled over a member, and hence the rugged-structure layer can exhibit yet better conforming ability. More preferably, the yield strain is 2% or greater, yet more preferably 4% or greater and particularly preferably 5% or greater. More preferably, the tensile elongation is 50% or greater, yet more preferably 100% or greater and particularly preferably 160% or greater. The upper limits of the yield strain and tensile elongation are not particularly limited, but sufficient shape conforming ability can be obtained if the yield strain ranges from 1% to 30% and the tensile elongation ranges from 10% to 500%.

By virtue of the production method involved, the self-supporting film in the present embodiment does not require a base material layer that supports the rugged-structure layer. Therefore, a pressure-sensitive adhesive agent layer or adhesive agent layer can be directly provided on the rear face of the rugged-structure layer. Thus, an extremely thin self-supporting structure can be achieved by directly providing a pressure-sensitive adhesive agent layer or adhesive agent layer on the rear face of the rugged-structure layer.

A pressure-sensitive adhesive agent or adhesive agent that is preferably used is a pressure-sensitive adhesive agent or adhesive agent that is appropriately used in optical material applications. Preferred examples of specific pressure-sensitive adhesive agents include, for instance, urethane pressure-sensitive adhesive agents or acrylic pressure-sensitive adhesive agents. Preferred examples of specific adhesive agents include, for instance, acrylic adhesive agents, urethane adhesive agents, epoxy adhesive agents and UV-curable adhesive agents. The smaller the thickness of the pressure-sensitive adhesive agent or adhesive agent, the more preferable the thickness is, within a thickness range that makes it possible to secure a practical (pressure-sensitive) adhesive strength while suppressing deformation of the adherend shape. A release body that can be stripped off the rugged-structure layer may be can be directly provided on the rear face of the rugged-structure layer, without any pressure-sensitive adhesive agent layer or adhesive agent layer being provided on the rear face of the rugged-structure layer. The release body is not particularly limited, and may conceivably be, for instance, a glass substrate, a film base material, an optical element or the like. The release body may be not only of planar shape, but also of spherical surface shape.

Ordinarily, the self-supporting film is stored in a state where the release body that can be stripped off the self-supporting film is provided on the rear face of the self-supporting film, or a state where a pressure-sensitive adhesive material layer is provided on the rear face of the self-supporting film, and a release body that can be stripped off the pressure-sensitive adhesive material layer is provided on a face, of the pressure-sensitive adhesive material layer, on the opposite side to the face that has an anti-reflection film, so that, during use, the self-supporting film is stripped off the release body.

The self-supporting film according to the present embodiment is extremely thin, having a thickness average ranging from 0.2 µm to 20.0 µm, and has thus little rigidity. Therefore, a preferred storage method of the self-supporting film is a method that involves storing the self-supporting film in the form of a stack that comprises the self-supporting film, and a release body that is provided on the rear face of the self-supporting film, such that the release body can be stripped off the self-supporting film and cross-sections of the release body in two perpendicular axial directions are those of a curved surface shape, or a method that involves storing the self-supporting film in the form of a stack that comprises the self-supporting film, a pressure-sensitive adhesive material layer that is provided on the rear face of the anti-reflection film, and a release body that is provided on the face, of the pressure-sensitive adhesive material layer, on the opposite side to the face that has the self-supporting film, such that the release body can be stripped off the pressure-sensitive adhesive material layer and cross-sections of the release body in two perpendicular axial directions are those of a curved surface shape. If the cross-sections of the release body in two perpendicular axial directions are those of a curved surface shape, it becomes easier to peel the corners of the self-supporting film, or the self-supporting film having the pressure-sensitive adhesive material layer, from the release body, and handleability significantly enhanced, as compared with the case of a release body having a planar shape or a shape (for instance, a roll shape) such that the cross section is that of a curved surface shape in one axial direction alone. A configuration wherein a release body is directly provided on the rear face of the rugged-structure layer, such that the release body can be stripped off the self-supporting film and cross-sections of the release body in two perpendicular axial directions are those of a curved surface shape, or a configuration wherein a pressure-sensitive adhesive material layer is directly provided on the rear face of the rugged-structure layer and a release body is provided on the face, of the pressure-sensitive adhesive material layer, on the opposite side to the face that has the rugged-structure layer, such that the release body can be stripped off the pressure-sensitive adhesive material layer and cross-sections of the release body in two perpendicular axial directions are those of a curved surface shape, are preferred configurations, in that these configurations afford a self-supporting film that is thin after stripping off the release body and that has excellent shape conforming ability.

The self-supporting film of the invention of the present application is excellent in shape conforming ability, and therefore can be appropriately used, for instance, in image display devices, such as touch panels, liquid crystal display panels, plasma displays, organic EL displays or the like; projection optical systems such as projectors; observation optical systems such as optical lenses; image-capture optical systems such as cameras; and optical elements such as polarizing beam splitters, emission tips in light-emitting diodes, surfaces of solar cell panels and the like.

Second Embodiment

A second embodiment of the present invention will be explained next.

In the second embodiment, the self-supporting film according to the present invention is used as a pellicle film in a pellicle. Recent years have witnessed a demand for ever lower prices in semiconductor components.

Accordingly, economic considerations mandate that foreign matter adhered to pellicle films should be removed readily, and that the pellicle be capable of being used repeatedly. However, foreign matter adhered to the pellicle surface was difficult to remove in conventional pellicle films, while high-pressure and high-flow rate air blowing was required in order to remove the foreign matter. This gave rise to the problem of deflection or breakage of the pellicle film, on account of air pressure, and the problem of adhesion of the pellicle film to a polymer material, likewise on account of air pressure.

Figure 10:
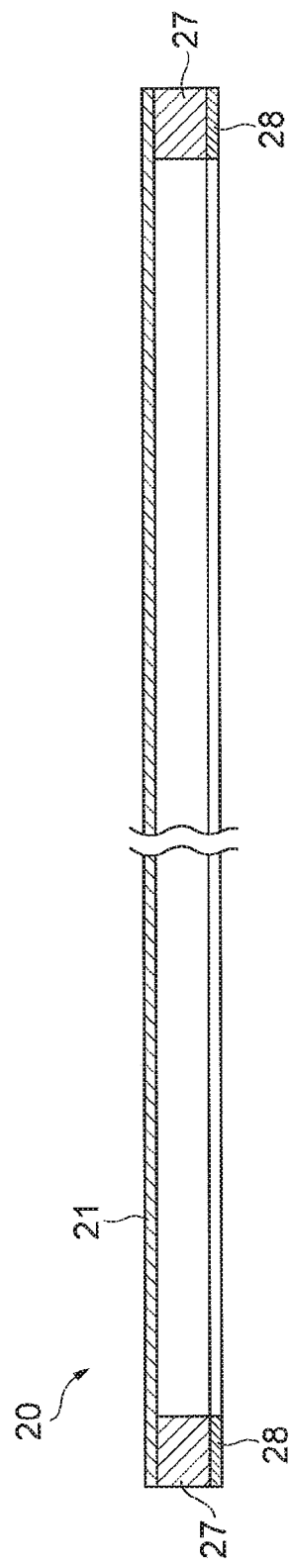
FIG. 10 is a cross-sectional diagram of a pellicle according to a second embodiment.

In the light of the above problems, therefore, the pellicle according to the second embodiment affords a pellicle film to which foreign matter does not adhere readily, and such that, even when foreign matter becomes adhered to the pellicle film, the foreign matter can be removed easily by air blowing. FIG. 10 is a cross-sectional diagram of a pellicle according to the second embodiment. As illustrated in FIG. 10, a pellicle 20 according to the second embodiment has a frame body 27, a pressure-sensitive adhesive agent 28 that is applied onto one end face of the frame body 27, and a pellicle film 21, being a self-supporting film, that is bonded to the other end face of the frame body 27.

Figure 6:
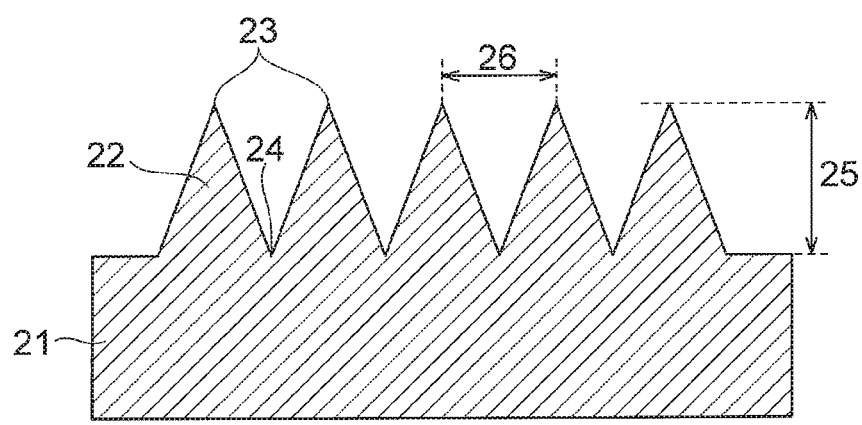
FIG. 6 is a partial enlarged cross-sectional diagram of an example of a self-supporting film according to an embodiment of the present invention.

FIG. 6 is a partial enlarged cross-sectional diagram of an example of a self-supporting film according to an embodiment of the present invention.

A pellicle film 21 according to the present embodiment is provided with a plurality of protruding structures 22 on at least one face. In the pellicle film 21 according to the second embodiment, the protruding structures 22 correspond to the protrusions that form the rugged shapes, and a layer that comprises the protruding structures 22 corresponds to the rugged-structure layer in which the rugged shapes are formed.

In the case of a pellicle film having a plurality of protruding structures, the contact surface area between the pellicle film and adhered foreign matter, if any, of a size greater than the apex spacing between one protruding structure and another protruding structure that is closest thereto (hereafter, simply referred to as spacing 6 between protruding structures) is greater than the contact surface area in the case of a flat pellicle film. Therefore, foreign matter is less likely to adhere to the pellicle film, and even when foreign matter becomes adhered to the pellicle film, the foreign matter can be easily removed during air blowing. The protruding structures denote herein convex shapes having a height of 30 nm or more. Also, a height 25 of the protruding structures denotes the difference between apices 23 of the protruding structures and bottom points 24 of the protruding structures.

Adhesion of micro-scale foreign matter, in particular, is often a problem in pellicle films Once adhered to conventional pellicle films, such micro-scale foreign matter is not easy to remove. However, if a pellicle film is used wherein the spacing between protruding structures is 1.0 µm or less, then the contact surface area between the pellicle film and foreign matter is small, also in the case of micro-scale foreign matter. As a result, foreign matter does not adhere readily to the pellicle film, and even if it does, the foreign matter can be very easily removed during air blowing. The spacing between protruding structures denotes herein the apex spacing between a protruding structure of interest and a protruding structure that is closest thereto. In the case where the apex portions of the protruding structures are horizontal planes, then the centroids of the horizontal planes are taken as the apices of the protruding structures.

The shape of the protruding structures is not particularly limited. The protruding structures may conceivably have, for instance, a cross-sectional shape, in the film thickness direction, that is trapezoidal, rectangular, square or prismatic, or a sinusoidal wave shape, for instance a triangular or semicircular shape. Herein, a sinusoidal wave shape denotes a shape having a curved portion that comprises repetitions of depressions and projections. It is sufficient for the curved portion to be a bent curve, and thus the sinusoidal wave shape encompasses also shapes in which projections exhibit constrictions. A triangular shape or sinusoidal wave shape is preferred, among these cross-sectional shapes, since in that case the effect of suppressing foreign matter adhesion is more pronounced, and foreign matter is removed particularly easily during air blowing. The pellicle film having protruding structures is advantageous in terms of eliciting a high reflection suppression effect described below.

The protruding structures may be provided on one face alone of the pellicle film, or on both faces. If provided on both faces, the effect of suppressing foreign matter adhesion can be imparted to both faces of the pellicle film Doing so is preferable, since the below-described anti-reflection effect can be enhanced vis-à-vis the effect that is elicited when the protruding structures are provided on one face alone.

An anti-reflection layer may be provided on the surface of the protruding structures or on the face, of the pellicle film, on the side opposite to the face at which the protruding structures is provided. The anti-reflection layer may be a single layer or a multilayer. Examples of the material of the anti-reflection layer that can be appropriately used include, for instance, a tetrafluoroethylene-vinylidene fluoride-hexafluoropropylene terpolymer, a fluororesin having a perfluoroalkyl ether cyclic structure (preferably, in particular, Teflon (registered trademark) AF by Du Pont; Cytop (trade name) by Asahi Glass, or Algoflon (trade name) by Ausimont, or polyfluoroacrylate); or a material having a low refractive index, for instance calcium fluoride, magnesium fluoride or barium fluoride.

The material that is used in the protruding structures and the film material of the pellicle film is not particularly limited, but is preferably a material having high light transmittance at the exposure wavelength at which the pellicle film is used. Conceivable specific examples thereof include, for instance, cellulose derivatives (cellulose acetate, cellulose acetate propionate, cellulose acetate butyrate, or the like, or mixtures of two or more of the foregoing); cycloolefin resins (for instance, polymers or copolymers (including hydrogenated ones) of norbornene, for instance Apel (registered trademark) (by Mitsui Chemicals), Topas (registered trademark) (by Polyplastics), Zeonex (registered trademark) or Zeonor (registered trademark) (by Zeon), Arton (registered trademark) (JSR) or the like); or fluororesins (for instance, a tetrafluoroethylene-vinylidene fluoride-hexafluoropropylene terpolymer, a fluororesin having a perfluoroalkyl ether cyclic structure (preferably, in particular, Teflon (registered trademark) AF by Du Pont; Cytop (trade name) by Asahi Glass, or Algoflon (trade name) by Ausimont). From among the above resins, in particular, a fluororesin having a perfluoroalkyl ether cyclic structure, cellulose acetate propionate, cellulose acetate butyrate or a cycloolefin resin is preferably used as the main component of the pellicle film material and of the material that is used in the protruding structures, since in that case the formability of the pellicle film and of the protruding structures is particularly good. The term main component indicates that the amount of resin component in the pellicle film material is 50 wt % or greater.

Light resistance is poor, for instance, if nitrocellulose is used as the main component, in that nitrocellulose degrades quickly when irradiated at a wavelength of 300 nm or shorter. Therefore, despite the high transmittance of nitrocellulose, using the latter is not very desirable, on account of the shortened film life. Moreover, nitrocellulose itself is explosive, and hence production of nitrocellulose becomes ever more difficult as the content thereof increases.

A structure may be resorted to wherein the film material of the pellicle film and the material of the protruding structures is the same material; alternatively, a rugged-structure layer may be provided on the pellicle film, such that the rugged-structure layer has protruding structures formed of a dissimilar material, i.e. a material different from that of the pellicle film. From the viewpoint of ease of production, preferably, the film material of the pellicle film and the material of the protruding structures are identical.

Preferably, the protruding structures are disposed at a constant periodic spacing, since in that case foreign matter removal during air blowing is particularly easy, and the below-described anti-reflection effect is more pronounced. The reason why removal of foreign matter during air blow is particularly easy when the protruding structures are disposed at a constant periodic spacing is not clear, but it is deemed that periodic protruding structures result in smoother airflow during air blowing, so that foreign matter can be removed at a lower blowing pressure. The period of the protruding structures need not be a constant period across the entire surface of the pellicle film, and protruding structures of dissimilar periods may be provided in part. In terms of suppressing adhesion of micro-scale foreign matter, the periodic spacing is preferably 1.0 µm or less.

If the periodic spacing of the protruding structures is about the same or smaller than the used wavelength, a reflection suppression effect is also enhanced, besides the above-described effect of suppressing foreign matter adhesion. Herein, a reflection suppression effect denotes the effect of suppressing reflection of exposure light on the pellicle film interface when exposure light strikes the pellicle film. Suppression of reflection allows not only reducing stray light, but also preventing loss of light intensity upon exposure, in that the effectively transmitted light is substantial. Wavelengths of 500 nm or shorter are ordinarily used for exposure, though in recent years, in particular, wavelengths of 200 nm or shorter have come to be used in response to the trend towards finer structures. In order to enhance the reflection suppression effect, therefore, the periodic spacing of the protruding structures is preferably 500 nm or smaller, more preferably 200 nm or smaller, yet more preferably 150 nm or smaller, and particularly preferably 100 nm or smaller. The reflection suppression effect and effect of suppressing foreign matter adhesion become more pronounced as the periodic spacing of the protruding structures becomes shorter. Therefore, the shorter the periodic spacing of the protruding structures, the more preferable the periodic spacing is, in terms of the reflection suppression effect and the effect of suppressing foreign matter adhesion. The lower limit of periodic spacing is not particularly limited, but the periodic spacing is preferably set to 50 nm or greater, in terms of striking a balance between performance and manufacturing costs, since the latter increase as the periodic spacing becomes shorter.

A sufficient effect of suppressing foreign matter adhesion can be achieved if the height of the protruding structures is 30 nm or greater. Preferably, the height of the protruding structures is large, since this translates into a more pronounced effect of suppressing foreign matter adhesion and a more pronounced reflection suppression effect. More preferably, the periodic spacing of the protruding structures is 70 nm or greater, particularly preferably 100 nm or greater. Preferably, the height of the protruding structures ranges from 0.5 times to 2.0 times, in particular 1.0 time to 2.0 times, the periodic spacing of the protruding structures, since in that case the reflection suppression effect is particularly pronounced. The periodic spacing of the protruding structures corresponds to the periodic spacing of the rugged shapes or protrusions.

Figure 7:
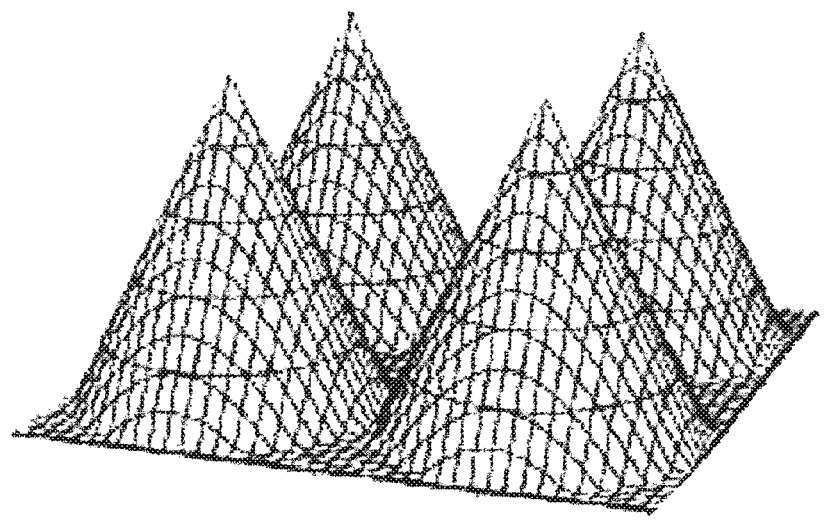
FIG. 7 is a partial enlarged perspective-view diagram of a self-supporting film according to an embodiment of the present invention.
Figure 8:
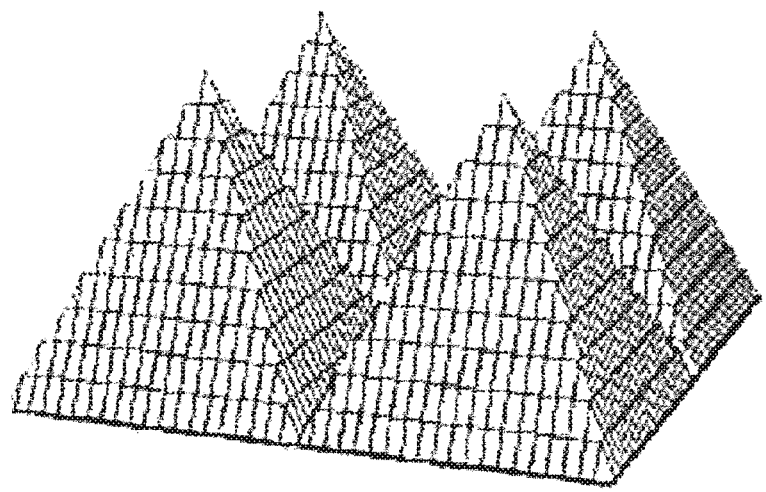
FIG. 8 is a partial enlarged perspective-view diagram of a self-supporting film according to another embodiment of the present invention.

In a case where the protruding structures have the conical shape illustrated in FIG. 7 or the pyramidal shape illustrated in FIG. 8, the height of the protruding structures is preferably 0.3 or more times the used wavelength, since a pronounced reflection suppression effect can be achieved in that case. If the shape of the protruding structures is a square pyramidal shape, the height of the protruding structures is preferably 0.5 or more times the used wavelength; in the case of a conical shape, the height of the protrusions is 0.45 or more times the used wavelength; and in the case of a shape where cones are superposed in the horizontal direction, the height of the protrusions is preferably 0.65 or more times, since a particularly high reflection suppressing effect can be achieved in those cases. The upper limit value of the height of the protruding structures is not particularly limited, but a sufficient reflection suppression effect is obtained up to 1 µm.

The shape of the protruding structures is not particularly limited, but is preferably a shape that changes continuously in the height direction, since in that case the effect of suppressing foreign matter adhesion and the reflection suppression effect are particularly pronounced. Specific conceivable examples of such shapes include, for instance, pyramidal shapes and conical shapes.

Preferably, portions of the pellicle film where no protruding structures are present are as few as possible, in terms of enhancing both the effect of suppressing foreign matter adhesion and the reflection suppression effect. Specifically, the occupancy of protruding structures in the pellicle film surface is preferably 70% or greater, more preferably 85% or greater, and particularly preferably 95% or greater. Preferably, the bottom face shape of the protruding structures is a shape that allows for gap-less tessellation on the plane of the pellicle film, in order to increase the occupancy of the protruding structures on the pellicle film surface.

Figure 9:
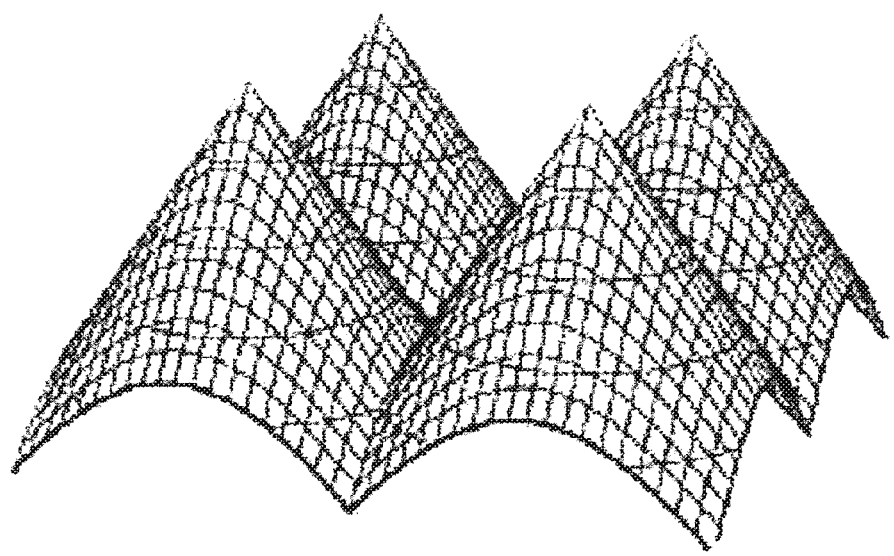
FIG. 9 is a partial enlarged perspective-view diagram of a self-supporting film according to another embodiment of the present invention.

Preferably, the protruding structures are grid-like protruding structures extending in a one axial direction, or, if a pyramidal shape or a truncated polyhedral pyramidal shape is used, protruding structures such that the bottom faces thereof can be tessellated, for instance triangular, quadrangular or hexagonal bottom faces. In a case where cones or truncated conical shapes are used, a hexagonal close-packed structure is preferably resorted to. More preferably, the shapes are disposed as shown in FIG. 9 in such a manner that the skirts of adjacent cones overlap each other, in such a way that as few planar portions as possible are formed in the pellicle film surface.

A method for manufacturing the pellicle film of the invention of the present application is explained next.

The pellicle film of the invention of the present application can be produced by forming a pellicle film through application of a pellicle film material onto the surface of a substrate for forming a pellicle, having recessed shapes on the surface thereof, to a predetermined film thickness, followed by stripping of the pellicle film off the substrate for forming a pellicle.

A preferred material of the substrate for forming a pellicle is a material that allows securing sufficient planarity, and is preferably, for instance, synthetic quartz, fused quartz, alkali-free glass, low-alkali glass, soda lime glass, silicon, a nickel sheet or the like. In particular, silicon is preferably used, since silicon allows securing the planarity of the substrate surface, with high precision, and allows forming easily a rugged pattern on the substrate surface. The smaller the coefficient of thermal expansion of the film formation substrate, the more preferable the coefficient is, in the light of the concern of breakage of the film formation substrate on account of uneven temperature during the below-described drying of the pellicle film. In particular, the linear expansion coefficient from 0° C. to 300° C. is preferably 50×10−7 m/° C. or less. It is sufficient for the protruding shape or recessed shapes of the film formation substrate surface to be imparted with a shape that corresponds to the rugged shapes of the above-described protruding structures.

A method for producing the film formation substrate having recessed shapes on the substrate surface is explained next.

A photoresist (photosensitive material) is coated onto synthetic quartz glass having a chromium thin-film layer, and the whole is pre-baked. Thereafter, recessed shapes are drawn on the resist using an electron beam exposure apparatus. The drawn recessed shapes are shapes that correspond to the protruding structures on the pellicle film. After a developing treatment, the chromium layer portion that is exposed from the pattern of the resist is etched, and the resist pattern is transferred to the chromium layer. Lastly, the resist residue is washed, to produce a reticle.

A resist is uniformly coated onto the film formation substrate, followed by prebaking to fix the resist. Using a reduction-projection exposure apparatus (stepper), which is an apparatus for semiconductor element manufacture, a fine pattern of the reticle produced earlier is reduced using a reduction-projection lens, and projection exposure is carried out while the apparatus moves over a wafer coated with the resist. The resist in the photosensitized portion is removed through immersion in an organic alkaline developing solution. The photosensitized residue is completely removed by being rinsed, several times, with ultrapure water, followed by heating. The portions not covered by the resist are selectively etched by dry etching, to form a fine pattern on the wafer. Lastly, the solvent is completely removed from the resist, as a result of which there can be obtained a film formation substrate having protruding shapes or recessed shapes on the substrate surface. The shape of the recessed shapes on the film formation substrate can be freely modified by modifying the pattern size of the reticle and the exposure and etching conditions.

Next, a method for producing the self-supporting film having protruding structures on the film will be explained based on an example of a method for producing a pellicle film.

The pellicle film having protruding structures on the film can be produced by coating a film formation substrate, having the above-described recessed shapes, with a pellicle film material, to a predetermined film thickness.

The pellicle film is preferably produced by using a polymer solution wherein the pellicle film material is dissolved in an organic solvent. Preferably, very little solvent volatilizes at ambient temperature, and the solvent has a boiling point that is not excessively high. Such being the case, the boiling point of the solvent ranges preferably from 100 to 200° C.

Examples of such a solvent include, for instance, aliphatic hydrocarbon compounds, aromatic compounds, halogenated hydrocarbons such as chlorinated hydrocarbons, ester compounds, ketone compounds and the like. Organic solvents from among the foregoing that can be appropriately used for cycloolefin resins include, for instance, saturated aliphatic hydrocarbon compounds such as alicyclic hydrocarbons, as well as aromatic compounds, halogenated hydrocarbons or the like. Cellulose derivatives can dissolve in a single or mixed organic solvent of chlorinated hydrocarbons, ketones, esters, alkoxyalcohols, benzene, alcohols and the like. Examples of such organic solvents include, for instance, organic solvents such as chlorinated hydrocarbons, ester compounds, ketone compounds and the like. Examples of chlorinated hydrocarbon that can be appropriately used include, for instance, methylene chloride, ethylene chloride and propylene chloride. Examples of ketone-compound organic solvents include, for instance, acetone, methyl ethyl ketone, methyl isobutyl ketone and the like. Examples of ester-compound organic solvents that are appropriately used include, for instance, acetic acid esters (methyl acetate, ethyl acetate, butyl acetate and the like) and lactic acid esters (ethyl lactate, butyl lactate and the like). Other than the above there can be used a single or mixed solvent of benzene, ethanol, methanol, cellosolve acetate, carbitol and the like. Preferably, the polymer solution in which the pellicle film material is dissolved has an absorbance of 0.05 or less, in order to increase the light transmittance of the pellicle film and reduce the amount of foreign matter in the pellicle film.

Examples of the film formation method of the pellicle film and the production method of the protruding structures include, although not limited thereto, spin coating, roll coating, knife coating, casting or the like, although spin coating is preferred in terms of homogeneity and management of foreign matter. A film production method by spin coating is explained next.

Film thickness and film planarity in the pellicle film are mainly determined by the liquid temperature of the polymer solution, the ambient temperature and humidity, and the revolutions of the film formation substrate. The liquid temperature of the polymer solution is preferably about the same as ambient temperature (10 to 30° C.), and the temperature of the film formation substrate as well is preferably about the same as ambient temperature. The liquid temperature, the ambient temperature and the temperature of the film formation base are preferably substantially identical, since film thickness variability can be suppressed in such a case. Preferably, humidity ranges from 30 to 60%. An appropriate amount of polymer solution is dripped onto the film formation substrate, and thereafter film formation is performed by spinning the film formation substrate at 50 to 5000 revolutions per minute. An appropriate film thickness of the pellicle film ranges from about 0.2 µm to 10 µm. In terms of ease of production of a strong and homogeneous pellicle film, the pellicle film according to the present invention has a film thickness ranging from 0.3 µm to 8 µm. Film thickness denotes herein the distance from the apices of the protruding structures up to the face having no protruding structures, in a case where the protruding structures are provided on only one face of the pellicle film, and denotes the shorter distance from among the distance from the apices of the protruding structures on one face, up to the apices of the protruding structures on the other side, in a case where the protruding structures are provided on both faces of the pellicle film.

After film formation, the film formation substrate is placed on a heated hot plate, and is left to dry, to cause the solvent to volatilize thereby. After drying, the film is stripped off the substrate. In doing so, stress acts on the film; preferably, therefore, the film material has extensibility. Releasability is an important issue upon stripping of a film off a substrate. The contact angle between the substrate and the film material must be optimized in order to facilitate film formation and stripping after film formation. Silane coupling is a known method of controlling the contact angle of substrates. In order to elicit coupling of a substrate that comprises an inorganic material, preferably, a silane having an ether bond at one terminus is brought into contact with the substrate surface, and the silane is caused to react. Releasability is enhanced by using, as the other terminal group, a group having low affinity with the film material. In order to realize high releasability, preferably, the other terminal group is, in particular, fluorine, since fluorine is highly effective as a releasing agent.

The material of the protruding structures and the pellicle film material may be the dissimilar materials. Particularly preferably, however, the material of the protruding structures and the pellicle film material are identical, since in that case the protruding structures and the pellicle film can be produced in the same production process. In a case where the material of the protruding structures and the pellicle film material are dissimilar, the production method may involve coating the material of the protruding structures onto the film formation substrate, and drying or half-drying then the material, followed by overlaying of the pellicle film material.

Besides the above-described pellicle film manufacturing method, a pellicle film having protruding structures can be manufactured by pressing a pellicle film material, having fluidity, against a substrate, to cause recessed shapes in the substrate to be transferred thereby to the resin. Preferably, the pellicle film material used in that case is in a state resulting from imparting fluidity through addition of 0 to 30 wt % of solvent to the resin. The recessed shapes of the substrate can be transferred to the film by stripping thereafter the film off the substrate. In terms of production, a film material having extensibility is preferably used as a main component. Examples of materials that satisfy the above conditions include, for instance, amorphous fluororesins, preferably, in particular, fluororesins having a perfluoroalkyl ether cyclic structure, such as Cytop (trade name), by Asahi Glass.

EXAMPLES

The present invention will be explained next in further detail based on examples, but the present invention is not limited in any way to these examples.

Evaluation Method (1) Thickness Average (µm) (of the Self-Supporting Film)

Figure 3:
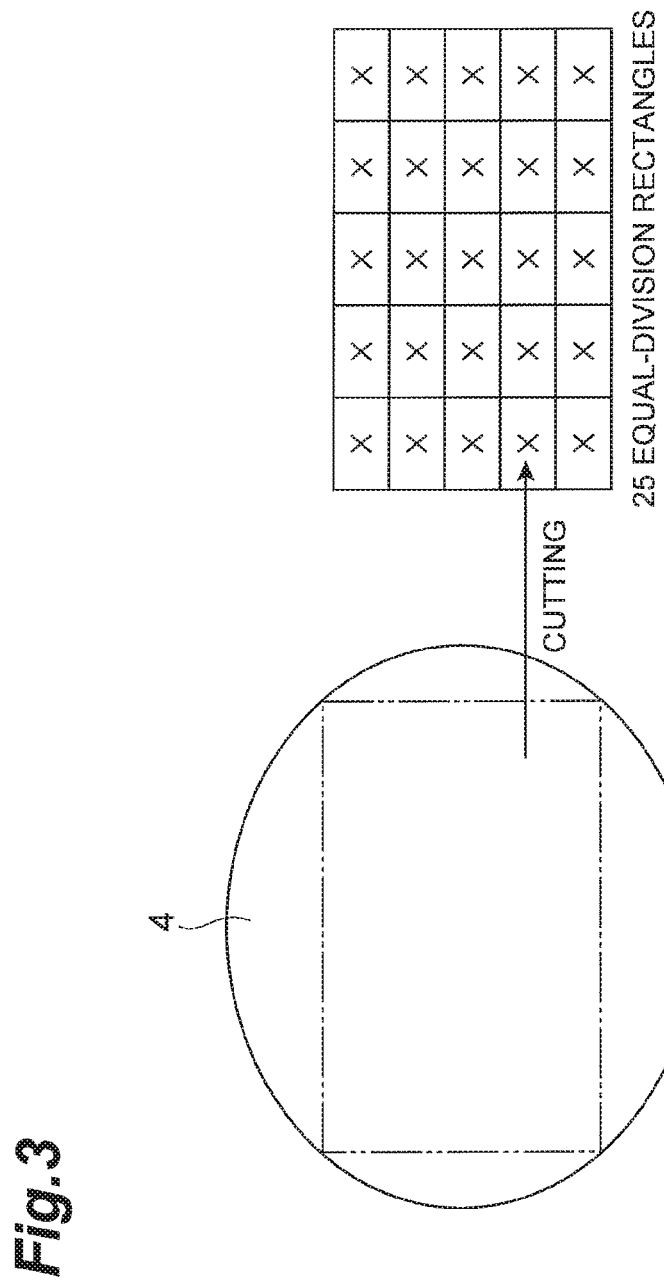
FIG. 3 is a diagram illustrating measurement points for calculating a thickness average of a self-supporting film according to an embodiment of the present invention.

As illustrated in FIG. 3, a self-supporting film 4 to be measured was cut to a rectangle having the greatest surface area within the self-supporting film 4. Then, straight lines were then drawn from a long side and a short side of the cut rectangle, so as to yield five equal divisions per side, and the center point of each of the resulting 25 equal-division squares was located. The thickness at the center points was measured (measurement wavelength 248 nm) using a transmission spectroscopy film thickness gauge (FE1300, by Otsuka Electronics). The average value of the measurement values in the measured 25 points was taken as the thickness average.

(2) Thickness Variability Average (Nm)

The surface shape of the rugged surface of each of the 25 equal-division specimens obtained as described above was measured using an AFM (atomic force microscope). For each specimen there was calculated the average value of the distance between recess bottom points, in the layer thickness direction of the rugged-structure layer. The thickness variability average was the mean value of the average values calculated for the 25 specimens.

(3) Yield Strain (%) and Tensile Elongation (%) of the Resin Composition as a Starting Material The measurements were performed according to JIS K 7113, at a tensile rate of 1 mm/min. An instrument AGS-50G, by Shimadzu, was used in the measurements.

(4) Yield Strain (%) and Tensile Elongation (%) of the Rugged-Structure Layer

The measurements were performed according to JIS K 7127, at a tensile rate of 1 mm/min. An instrument AGS-50G, by Shimadzu, was used in the measurements.

Example 1

A photoresist (photosensitive material) was coated onto synthetic quartz glass having a chromium thin-film layer, and was pre-baked. Thereafter, a fine pattern was drawn on the photoresist, over a 40 mm×80 mm region, using an electron beam exposure apparatus. As the drawn shapes within the 40 mm×80 mm region, an array of elements, each measuring 300 µm×100 µm, was drawn in a closely-packed manner within the 40 mm×80 mm region, in such a manner that adjacent elements did not overlap each other. After a developing treatment, the chromium layer portion that was exposed from the pattern of the resist was etched, and the resist pattern was transferred to the chromium layer. Lastly, the resist residue was washed, to produce a reticle.

A photoresist was coated uniformly, using a spin coater, onto a silicon substrate (12 inch, 300 mmϕ), followed by pre-baking to fix the photoresist. Using a reduction-projection exposure apparatus (stepper), which is an apparatus for semiconductor element manufacture, a fine pattern of the reticle produced earlier was reduced to ¼ using a reduction-projection lens, and projection exposure was carried out while the apparatus moved over a wafer coated with the resist. Thereafter, the resist in the photosensitized portion was removed through immersion in an organic alkaline developing solution. The photosensitized residue was completely removed by being rinsed, several times, with ultra-pure water, followed by heating. The portions not covered by the resist were selectively etched by dry etching, to form a fine pattern on the wafer. Lastly, the resist was completely removed using a solvent. In the present instance, the pattern size of the reticle and the exposure and etching conditions were modified to prepare thereby a film formation substrate having rugged shapes of conical shape, with a period of 150 nm and depth of 180 nm.

The surface of the prepared film formation substrate was subjected next to silane coupling, to enhance releasability. Next, Cytop CTX-809SP2 (trade name, by Asahi Glass, yield strain about 5%, tensile elongation about 175%), which is a solution comprising, as a film material, an amorphous fluororesin having a perfluoroalkyl ether cyclic structure, was adjusted through dilution using perfluorotributylamine (Fluorinert FC-43, trade name, by Sumitomo 3M). The concentration of the amorphous fluororesin having a perfluoroalkyl ether cyclic structure and comprised in the polymer solution was 3 wt %. Then, 30 cc of the prepared polymer solution were dripped onto the film formation substrate, and spin coating was performed, on a spin coater, under conditions that involved revolutions of 300 rpm and spinning time of 50 seconds.

Next, the film formation substrate was dried, for 5 minutes each, on a hot plate at 80° C. and at 180° C., and the dried film was stripped off the film formation substrate, to yield thereby a rugged-structure layer (self-supporting film) having a surface area of 706.5 cm². The thickness average of the obtained rugged-structure layer was 0.7 µm, and the thickness variability average of the rugged-structure layer was 10 nm. The central portion of the obtained rugged-structure layer was cut to a square of 5 cm×5 cm, and the thickness average of the cut rugged-structure layer and the thickness variability average of the rugged-structure layer were measured. The thickness average of the rugged-structure layer was 0.7 µm, and the thickness variability average of the rugged-structure layer was 5 nm. The cut rugged-structure layer was observed by AFM, which revealed the formation of periodic rugged shapes having a height of 180 nm and a period length of 150 nm. The produced rugged-structure layer exhibited a yield strain of 5% and a tensile elongation of 175%.

Next, the rugged-structure layer was cut to a 5 cm×5 cm square. Straight lines were then drawn from an arbitrary side of the cut square, and from a side standing at right angles to the former side, so as to yield five equal divisions per side. The center of each of the resulting 25 equal-division squares was measured using a transmission spectroscopy film thickness gauge (FE1300, by Otsuka Electronics). The measurement was performed at a wavelength of 248 nm and 365 nm. The transmittance measurement of the 25 equal-division squares at the wavelength of 248 nm revealed that the difference between the point with highest transmittance and the point with lowest transmittance was 1%. The transmittance measurement of the 25 equal-division squares at the wavelength of 365 nm revealed that the difference between the point with highest transmittance and the point with lowest transmittance was 0.5%.

The rugged-structure layer cut to a 5 cm×5 cm square was then affixed to a transparent sphere having a diameter of 8 cm. The rugged-structure layer could be affixed to the transparent sphere without gaps and without occurrence of folded portions. No color unevenness at all was appreciated upon naked-eye observation of the transparent sphere with the affixed rugged-structure layer.

Example 2

A polymer solution was produced by dissolving cellulose acetate propionate (CAP 480-20, by Eastman Chemical Company, yield strain about 4%, tensile elongation about 15%) in ethyl acetate.

The concentration of cellulose acetate propionate in the polymer solution was 8 wt %. The surface of the film formation substrate prepared in Example 1 was subjected to silane coupling. Then, 30 cc of the prepared polymer solution were dripped onto the film formation substrate, and spin coating was performed, on a spin coater, under conditions that involved revolutions of 300 rpm and spinning time of 30 seconds.

Next, the film formation substrate was dried, for 5 minutes each, on a hot plate at 80° C. and at 180° C., and the dried film was stripped off the film formation substrate, to yield thereby a rugged-structure layer (self-supporting film) having a surface area of 706.5 cm². The thickness average of the obtained rugged-structure layer was 1.5 µm, and the thickness variability average of the rugged-structure layer was 61 nm. The central portion of the obtained rugged-structure layer was cut to a square of 5 cm×5 cm, and the thickness average of the cut rugged-structure layer and the thickness variability average of the rugged-structure layer were measured. The thickness average of the rugged-structure layer was 1.5 µm, and the thickness variability average of the rugged-structure layer was 53 nm. The cut rugged-structure layer was observed by AFM, which revealed the formation of periodic rugged shapes having a height of 180 nm and a period length of 150 nm. The produced rugged-structure layer exhibited a yield strain of 4% and a tensile elongation of 15%.

Next, the rugged-structure layer was cut to a 5 cm×5 cm square. Straight lines were then drawn from an arbitrary side of the cut square, and from a side standing at right angles to the former side, so as to yield five equal divisions per side. The center of each of the resulting 25 equal-division squares was measured using a transmission spectroscopy film thickness gauge (FE1300, by Otsuka Electronics). The measurement was performed at a wavelength of 248 nm and 365 nm. The transmittance measurement of the 25 equal-division squares at the wavelength of 248 nm revealed that the difference between the point with highest transmittance and the point with lowest transmittance was 3%. The transmittance measurement of the 25 equal-division squares at the wavelength of 365 nm revealed that the difference between the point with highest transmittance and the point with lowest transmittance was 5%.

The rugged-structure layer cut to a 5 cm×5 cm square was then affixed to a transparent sphere having a diameter of 8 cm. The rugged-structure layer could be affixed to the transparent sphere without gaps and without occurrence of folded portions. Virtually no color unevenness was appreciated upon naked-eye observation of the transparent sphere with the affixed rugged-structure layer.

Example 3

A polymer solution was produced by diluting Zeonor 1060R (trade name, by Zeon, yield strain about 4%, tensile elongation about 60%), which is a solution that contains a cycloolefin resin as a film material, in limonene (by Wako Pure Chemical Industries).

The concentration of cycloolefin resin comprised in the polymer solution was 8 wt %. The surface of the film formation substrate prepared in Example 1 was subjected to silane coupling. Then, the produced polymer solution was dripped onto the film formation substrate, and spin coating was performed, on a spin coater, under conditions that involved revolutions of 300 rpm and spinning time of 30 seconds. Next, the film formation substrate was dried, for 5 minutes each, on a hot plate at 80° C. and at 180° C., and the dried film was stripped off the film formation substrate, to yield thereby a rugged-structure layer (self-supporting film) having a surface area of 706.5 cm². The thickness average of the obtained rugged-structure layer was 3.0 µm, and the thickness variability average of the rugged-structure layer was 111 nm. The central portion of the obtained rugged-structure layer was cut to a square of 5 cm×5 cm, and the thickness average of the cut rugged-structure layer and the thickness variability average of the rugged-structure layer were measured. The thickness average of the rugged-structure layer was 3.0 µm, and the thickness variability average of the rugged-structure layer was 103 nm. The cut rugged-structure layer was observed by AFM, which revealed the formation of periodic rugged shapes having a height of 180 nm and a period length of 150 nm. The produced rugged-structure layer exhibited a yield strain of 4% and a tensile elongation of 60%.

Next, the rugged-structure layer was cut to a 5 cm×5 cm square. Straight lines were then drawn from an arbitrary side of the cut square, and from a side standing at right angles to the former side, so as to yield five equal divisions per side. The center of each of the resulting 25 equal-division squares was measured using a transmission spectroscopy film thickness gauge (FE1300, by Otsuka Electronics). The measurement was performed at a wavelength of 248 nm and 365 nm. The transmittance measurement of the 25 equal-division squares at the wavelength of 248 nm revealed that the difference between the point with highest transmittance and the point with lowest transmittance was 7%. The transmittance measurement of 25 equal-division squares at the wavelength of 365 nm revealed that the difference between the point with highest transmittance and the point with lowest transmittance was 4%.

The rugged-structure layer cut to a 5 cm×5 cm square was then affixed to a transparent sphere having a diameter of 8 cm. The rugged-structure layer could be affixed to the transparent sphere without gaps and without occurrence of folded portions. Slight color unevenness was appreciated upon naked-eye observation of the transparent sphere with the affixed rugged-structure layer.

Comparative Example 1

A polymer solution was prepared by dissolving poly(methyl methacrylate) (by Mitsubishi Rayon, no yield strain, tensile elongation about 6%) in a toluene solution. The concentration of poly(methyl methacrylate) comprised in the polymer solution was 6 wt %.

The surface of the film formation substrate prepared in Example 1 was subjected to silane coupling. Then, 30 cc of the prepared polymer solution were dripped onto the film formation substrate, and spin coating was performed, on a spin coater, under conditions that involved revolutions of 300 rpm and spinning time of 50 seconds. Next, the film formation substrate was dried, for 5 minutes each, on a hot plate at 80° C. and at 180° C. The film broke then upon stripping of the dried film off the film formation substrate.

Comparative Example 2

A rugged-structure layer was produced in accordance with the same production method as in Example 1, but herein the dripping amount of the polymer solution onto the film formation substrate and the revolutions of the spin coater were adjusted so as to yield a thickness average of 5.0 µm of the rugged-structure layer in the 5 cm×5 cm square. The dripping amount of the polymer solution was set to 30 cc, the revolutions of the spin coater were set to 500 rpm, and the spinning time to 30 seconds.

The rugged-structure layer cut to a 5 cm×5 cm square was then affixed to a transparent sphere having a diameter of 8 cm. Folded portions and gaps occurred in doing so.

Example 4

Production of a Silicon Wafer Having Recessed Shapes

A photoresist (photosensitive material) was coated onto synthetic quartz glass having a chromium thin-film layer, and was pre-baked. Thereafter, a fine pattern was drawn on a resist, over a 40 mm×80 mm region, using an electron beam exposure apparatus. As the drawn shapes within the 40 mm×80 mm region, an array of elements, each measuring 300 µm×100 µm, was drawn in a closely-packed manner within the 40 mm×80 mm region, in such a manner that adjacent elements did not overlap each other. After a developing treatment, the chromium layer portion that was exposed from the pattern of the resist was etched, and the resist pattern was transferred to the chromium layer. Lastly, the resist residue was washed, to produce a reticle.

A resist was coated uniformly, using a spin coater, onto a silicon substrate (12 inch, 300 mmφ), followed by pre-baking to fix the resist. Using a reduction-projection exposure apparatus (stepper), which is an apparatus for semiconductor element manufacture, a fine pattern of the reticle produced earlier was reduced to ¼ using a reduction-projection lens, and projection exposure was carried out while the apparatus moved over the wafer coated with the resist. Thereafter, the resist in the photosensitized portion was removed through immersion in an organic alkaline developing solution. The photosensitized residue was completely removed by being rinsed, several times, with ultra-pure water, followed by heating. The portions not covered by the resist were selectively etched by dry etching, to form a fine pattern on the wafer. Lastly, the resist was completely removed using a solvent. In the present instance, the pattern size of the reticle and the exposure and etching conditions were modified to prepare thereby a silicon wafer having, on the surface, recessed shapes 180 nm deep, at a random period ranging from 0.9 µm to 1.1 µm.

Next the surface of the silicon wafer surface was subjected to silane coupling, to enhance releasability of the rugged-structure layer (self-supporting film) Thereafter, a solution wherein Cytop CTX-809SP2 (trade name, by Asahi Glass), which is a solution comprising an amorphous fluororesin having a perfluoroalkyl ether cyclic structure, was diluted to 2% in perfluorotributylamine (Fluorinert FC-43, trade name, by Sumitomo 3M), was dripped onto a spin coater, to perform spin coating at 300 rpm, followed by drying for 5 minutes each on a hot plate at 80° C. and at 180° C., to yield a 3.1 µm-thick rugged-structure layer (self-supporting film).

The rugged-structure layer (self-supporting film) was stretched, and was affixed to a frame body (contour: length 149 mm×width 122 mm×height 5.5 mm, frame width 2 mm) made of aluminum and coated with an adhesive agent on the upper end face (other end face). An unwanted portion of the rugged-structure layer (self-supporting film) that jutted beyond the frame body was cut off. The prepared rugged-structure layer (self-supporting film) was observed by AFM, which revealed that protruding structures had been formed having a height of 180 nm and a random period of spacing ranging from 0.9 µm to 1.1 µm.

The rugged-structure layer (self-supporting film) was then left to stand for 10 days under conditions of class 10000 cleanliness, to wait for adhesion of foreign matter onto the rugged-structure layer (self-supporting film) After standing for 10 days, the rugged-structure layer (self-supporting film) was observed under a light-condensing lamp, and 20 spots of foreign matter having a size ranging from 1 µm to 10 µm were marked. The 20 spots of foreign matter were air-blown using a 0.65 mm-bore air gun nozzle, under conditions that included: pressure of 0.15 MPa, distance of 5 cm and angle of 45 degrees with respect to the rugged-structure layer (self-supporting film), and blowing time 5 seconds. The 20 spots of foreign matter were checked after air blowing. It was found that 10 spots of foreign matter had been removed, while 10 spots of foreign matter remained adhered.

Example 5

A rugged-structure layer (self-supporting film) was produced in accordance with a manufacturing method identical to that of Example 1, but herein the periodic spacing of the recessed shapes on the silicon wafer was set to a constant period of 1.0 µm. Observation of the obtained rugged-structure layer (self-supporting film) revealed that protruding structures were produced that had a height of 180 nm and a constant period with a 1.0 µm periodic spacing.

The rugged-structure layer (self-supporting film) was then left to stand for 10 days under conditions of class 10000 cleanliness, to wait for adhesion of foreign matter onto the rugged-structure layer (self-supporting film) After standing for 10 days, the rugged-structure layer (self-supporting film) was observed under a light-condensing lamp, and 20 spots of foreign matter having a size ranging from 1 µm to 10 µm were marked. The 20 spots of foreign matter were air-blown using a 0.65 mm-bore air gun nozzle, under conditions that included: pressure of 0.15 MPa, distance of 5 cm and angle of 45 degrees with respect to the rugged-structure layer (self-supporting film), and blowing time 5 seconds. The 20 spots of foreign matter were checked after air blowing. It was found that 13 spots of foreign matter had been removed, while 7 spots of foreign matter remained adhered.

Example 6

A rugged-structure layer (self-supporting film) was produced in accordance with a manufacturing method identical to that of Example 1, but herein the periodic spacing of the recessed shapes on the silicon wafer was set to a constant period of 150 nm. Observation of the obtained rugged-structure layer (self-supporting film) revealed that protruding structures were produced that had a height of 180 nm and a constant period with a 150 nm periodic spacing.

The rugged-structure layer (self-supporting film) was then left to stand for 10 days under conditions of class 10000 cleanliness, to wait for adhesion of foreign matter onto the rugged-structure layer (self-supporting film) After standing for 10 days, the rugged-structure layer (self-supporting film) was observed under a light-condensing lamp, and 20 spots of foreign matter having a size ranging from 1 µm to 10 µm were marked. The 20 spots of foreign matter were air-blown using a 0.65 mm-bore air gun nozzle, under conditions that included: pressure of 0.15 MPa, distance of 5 cm and angle of 45 degrees with respect to the rugged-structure layer (self-supporting film), and blowing time 5 seconds. The 20 spots of foreign matter were checked after air blowing. All 20 spots of foreign matter had been removed.

Comparative Example 3

A rugged-structure layer (self-supporting film) was produced in accordance with a manufacturing method identical to that of Example 4, but using herein a smooth-surface silicon wafer. A solution wherein Cytop CTX-809SP2 (trade name, by Asahi Glass), which is a solution comprising an amorphous fluororesin, was diluted to 4% in perfluorotributylamine (Fluorinert FC-43 trade name, by Sumitomo 3M) was dripped next on the obtained film, to perform spin coating at 300 rpm, followed by drying on a hot plate at 80° C. and at 180° C., to yield a 800 µm-thick rugged-structure layer (self-supporting film) provided with a reflection-suppressing layer.

The rugged-structure layer (self-supporting film) was then left to stand for 10 days under conditions of class 10000 cleanliness, to wait for adhesion of foreign matter onto the rugged-structure layer (self-supporting film) After standing for 10 days, the rugged-structure layer (self-supporting film) was observed under a light-condensing lamp, and 20 spots of foreign matter having a size ranging from 1 µm to 10 µm were marked. The 20 spots of foreign matter were air-blown using a 0.65 mm-bore air gun nozzle, under conditions that included: pressure of 0.15 MPa, distance of 5 cm and angle of 45 degrees with respect to the rugged-structure layer (self-supporting film), and blowing time 5 seconds. The 20 spots of foreign matter were checked after air blowing. It was found that 5 spots of foreign matter had been removed, while 15 spots of foreign matter remained adhered.

Example 7

Production of a Synthetic Quartz Glass Substrate Having Recessed Shapes

A photoresist (photosensitive material) was coated onto synthetic quartz glass having a chromium thin-film layer, and was pre-baked. Thereafter, a fine pattern was drawn on the resist, over an 800 mm×920 mm region, using an electron beam exposure apparatus. As the drawn shapes within the 800 mm×920 mm region, an array of elements shaped as 150 nm×150 nm lines and spaces at full pitch, was drawn in a closely-packed manner within the 800 mm×920 mm region, in such a manner that adjacent elements did not overlap each other. After a developing treatment, the chromium layer portion that was exposed from the pattern of the resist was etched, and the resist pattern was transferred to the chromium layer. Lastly, the resist residue was washed, to produce a reticle.

A resist was coated uniformly, using a spin coater, onto a synthetic quartz glass substrate (800 mm×920 mm), followed by pre-baking to fix the photoresist. Using a reduction-projection exposure apparatus (stepper), which is an apparatus for semiconductor element manufacture, a fine pattern of the reticle produced earlier was reduced to ¼ using a reduction-projection lens, and projection exposure was carried out while the apparatus moved over the synthetic quartz glass substrate coated with the resist. Thereafter, the resist in the photosensitized portion was removed through immersion in an organic alkaline developing solution. The photosensitized residue was completely removed by being rinsed, several times, with ultrapure water, followed by heating. The portions not covered by the resist were selectively etched by dry etching, to form a fine pattern on the substrate. Lastly, the resist was completely removed using a solvent. In the present instance, the pattern size of the reticle and the exposure and etching conditions were modified to prepare thereby a synthetic quartz glass substrate having, at the surface, recessed shapes 150 nm deep and having a random period of spacing ranging from 130 nm to 150 nm.

Next, the synthetic quartz glass substrate surface was subjected to silane coupling, to enhance releasability of the pellicle film. Thereafter, a polymer solution was produced by dissolving cellulose acetate propionate (CAP 480-20, by Eastman Chemical Company, yield strain about 4%, tensile elongation about 15%) in ethyl lactate.

The concentration of cellulose acetate propionate in the polymer solution was 8 wt %. The surface of the prepared film formation substrate was subjected to silane coupling, and thereafter, the produced polymer solution was dripped onto the film formation substrate, and spin coating was performed, on a spin coater, under conditions that involved revolutions of 250 rpm and spinning time of 200 seconds, followed by drying.

Next, an anti-reflection layer was provided by coating the film, by spin coating, with a fluoropolymer solution, followed by drying. The rugged-structure layer (self-supporting film) having the anti-reflection layer formed on the rugged structure film was stripped off the substrate, to yield a 4.0 μm-thick rugged-structure layer (self-supporting film)

The rugged-structure layer (self-supporting film) was stretched, and the rugged film side was affixed to a frame body (contour: long side 800 mm×short side 480 mm×height 4.0 mm; long side width 9.0 mm×short side width 7.0 mm) made of aluminum and coated with an adhesive agent on the upper end face (other end face). An unwanted portion of the rugged-structure layer (self-supporting film) that jutted beyond the frame body was cut off. The prepared rugged-structure layer (self-supporting film) was observed by AFM, which revealed that protruding structures had been formed having a height of 150 nm and a constant period of spacing ranging from 130 nm to 150 nm.

The rugged-structure layer (self-supporting film) was then left to stand for 10 days under conditions of class 10000 cleanliness, to wait for adhesion of foreign matter onto the rugged-structure layer (self-supporting film) After standing for 10 days, the rugged-structure layer (self-supporting film) was observed under a light-condensing lamp, and 20 spots of foreign matter having a size ranging from 1 μm to 10 μm were marked. The 20 spots of foreign matter were air-blown using a 0.65 mm-bore air gun nozzle, under conditions that included: pressure of 0.15 MPa, distance of 5 cm and angle of 45 degrees with respect to the rugged-structure layer (self-supporting film), and blowing time 5 seconds. The 20 spots of foreign matter were checked after air blowing. It was found that 10 spots of foreign matter had been removed, while 10 spots of foreign matter remained adhered.

Transmittance was measured next in the same way as in Example 1. The wavelength corresponded to a broadband of 290 nm to 700 nm. The point with lowest transmittance was 92%, and the average transmittance was 96%. This showed that the rugged structure film was also effective for broadband wavelengths.

INDUSTRIAL APPLICABILITY

The self-supporting film of the invention of the present application is excellent in shape conforming ability, and therefore can be appropriately used, for instance, in image display devices, such as touch panels, liquid crystal display panels, plasma displays, organic EL displays or the like; projection optical systems such as projectors; observation optical systems such as optical lenses; image-capture optical systems such as cameras; and optical elements such as polarizing beam splitters, emission tips in light-emitting diodes, surfaces of solar cell panels and the like.

The pellicle of the invention of the present application is not prone to have foreign matter adhered thereto, while any foreign matter that might adhere can be removed easily by air blowing. Accordingly, the pellicle can be used repeatedly, and is thus economically superior.

REFERENCE SIGNS LIST 1 rugged-structure layer
2 thin-film layer
3 coating layer
4 self-supporting film
5 periodic rugged shapes
6 rear face of rugged-structure layer
7 self-supporting film surface
8 self-supporting film rear face
9 drawn line
10 apex average height
11 rugged-structure layer thickness
12 aberration-derived positional offset
13 recess bottom point
14 (greatest) distance from recess bottom point to rear face of rugged-structure layer
15 (smallest) distance from recess bottom point to rear face of rugged-structure layer
16 thickness variability of rugged-structure layer
17 periodic spacing
20 pellicle
21 pellicle film
22 protruding structures
23 protruding structure apex
24 protruding structure bottom point
25 protruding structure height
26 protruding structure spacing
27 frame body
28 pressure-sensitive adhesive material

The invention claimed is:
1. A pellicle having comprising:
a frame body;
a pressure-sensitive adhesive agent that is applied onto one end face of the frame body; and
a self-supporting film bonded to the other end face of the frame body,
wherein the self-supporting film has a rugged-structure layer in which periodic rugged shapes are formed on at least one face,
wherein the pellicle has the rugged-structure layer on at least one of an inner surface and an outer surface of the self-supporting film,
wherein an average thickness of the self-supporting film ranges from 0.2 μm to 6.0 μm, and
wherein the rugged-structure layer comprises, as a main component, at least one resin selected from the group consisting of a cellulose acetate propionate and a cellulose propionate.
2. The pellicle according to claim 1, wherein the rugged-structure layer has a yield strain of 1% or greater and a tensile elongation of 10% or greater.

3. The pellicle according to claim 1, wherein a thickness variability average of the rugged-structure layer is 100 nm or less.

4. The pellicle according to claim 1, wherein protrusions in the rugged shapes are disposed at a constant periodic spacing.

5. The pellicle according to claim 1, wherein the periodic spacing of the protrusions of the rugged shapes is 1.0 μm or less.

6. The pellicle according to claim 1, wherein a height of the protrusions of the rugged shapes ranges from 0.5 times to 2.0 times the periodic spacing of the rugged shapes.

7. The pellicle according to claim 1, wherein the shape of the protrusions of the rugged shapes is a polyhedral pyramidal shape, a conical shape, a truncated polyhedral pyramidal shape or a truncated conical shape.

* * * * *